US012641760B2

(12) United States Patent
Fu et al.

(10) Patent No.: US 12,641,760 B2
(45) Date of Patent: May 26, 2026

(54) HEAT PLATE AND ELECTRONIC DEVICE

(71) Applicant: Honor Device Co., Ltd., Shenzhen (CN)

(72) Inventors: Guochao Fu, Shenzhen (CN); Fuli Cui, Shenzhen (CN); Yuanru Yang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 218 days.

(21) Appl. No.: 18/279,315

(22) PCT Filed: May 11, 2022

(86) PCT No.: PCT/CN2022/092145
§ 371 (c)(1),
(2) Date: Aug. 29, 2023

(87) PCT Pub. No.: WO2023/015999
PCT Pub. Date: Feb. 16, 2023

(65) Prior Publication Data
US 2024/0147679 A1 May 2, 2024

(30) Foreign Application Priority Data

Aug. 11, 2021 (CN) .......................... 202121877499.6
Sep. 30, 2021 (CN) .......................... 202122419143.4

(51) Int. Cl.
*H05K 7/20* (2006.01)
(52) U.S. Cl.
CPC ................................. *H05K 7/20963* (2013.01)

(58) Field of Classification Search
None
See application file for complete search history.

(56) References Cited

U.S. PATENT DOCUMENTS

| | | | | |
|---|---|---|---|---|
| 8,955,983 | B2* | 2/2015 | Reis ..................... | H04N 9/3144 |
| | | | | 165/10 |
| 9,625,215 | B2* | 4/2017 | Hsiao ..................... | G06F 1/203 |
| 10,194,521 | B2* | 1/2019 | Kim ..................... | H05K 1/0203 |
| 10,312,174 | B2* | 6/2019 | Vitale ..................... | G06F 1/203 |
| 11,745,463 | B2 | 9/2023 | Seo et al. | |
| 2017/0029279 | A1* | 2/2017 | Kim ..................... | C01B 32/186 |
| 2018/0023904 | A1* | 1/2018 | Kato ..................... | B32B 27/38 |
| | | | | 165/80.2 |
| 2018/0035528 | A1 | 2/2018 | Kim et al. | |
| 2018/0035529 | A1 | 2/2018 | Arai et al. | |
| 2018/0063996 | A1 | 3/2018 | Mtale | |
| 2019/0075683 | A1 | 3/2019 | Xu et al. | |
| 2020/0035602 | A1* | 1/2020 | Nam ................. | H01L 23/53276 |

FOREIGN PATENT DOCUMENTS

| | | |
|---|---|---|
| CN | 109822982 A | 5/2019 |
| CN | 110730594 A | 1/2020 |
| CN | 209964497 U | 1/2020 |
| CN | 112437723 A | 3/2021 |
| CN | 112467272 A | 3/2021 |
| CN | 112804851 A | 5/2021 |
| CN | 214708414 U | 11/2021 |

* cited by examiner

*Primary Examiner* — Mukundbhai G Patel
(74) *Attorney, Agent, or Firm* — Slater Matsil, LLP

(57) ABSTRACT

This application provides a vapor chamber and an electronic device. The vapor chamber is formed by arranging, in a stacked manner, a plurality of graphite sheets made of graphite or graphene.

20 Claims, 14 Drawing Sheets

<u>53</u>

53

| 532 | Polyethylene terephthalate PET film | |
|---|---|---|
| 530 | Graphite sheet | h |
| 531 | Adhesive layer | |
| 530 | Graphite sheet | h |
| 531 | Adhesive layer | |

53

53

53

<u>53</u>

| | |
|---|---|
| 532 | Polyethylene terephthalate PET film |
| 530 | Graphite sheet |
| 531 | Adhesive layer |
| 530 | Graphite sheet |
| 531 | Adhesive layer |

A-A

HEAT PLATE AND ELECTRONIC DEVICE

CROSS-REFERENCE TO RELATED APPLICATIONS

This application is a national stage of International Application No. PCT/CN2022/092145, filed on May 11, 2022, which claims priority to Chinese Patent Application No. 202121877499.6, filed on Aug. 11, 2021, and claims priority to Chinese Patent Application No. 202122419143.4, filed on Sep. 30, 2021. The disclosures of each of the aforementioned applications are hereby incorporated by reference in their entireties.

TECHNICAL FIELD

Embodiments of this application relate to the field of terminal technologies, and in particular, to a heat plate and an electronic device.

BACKGROUND

With the continuous improvement of electronic integration technologies, electronic devices are developing in the direction of miniaturization, lightening, and thinning, and the integration degree of electronic components in the electronic devices is increasingly high. In this way, the power consumption of electronic components is increasing, more heat is generated, and the heat is concentrated and difficult to be dissipated. Excessive heat will cause the temperatures of the electronic devices to rise, thereby affecting the performance and the life of the electronic devices.

To resolve the heat dissipation problem of the electronic device, a heat pipe (Heat Pipe, HP) is usually arranged in a middle frame of the electronic device, and a cavity for containing liquid media such as water or liquid ammonia is defined inside the heat pipe. The liquid medium transfers the heat generated by the electronic device from one end of the heat pipe to an other end of the heat pipe and releases the heat by its own phase change, so that the temperature of the electronic device can be reduced.

However, because the cavity for storing the liquid medium is provided inside the heat pipe, limited by this structure, the thickness value of the heat pipe is relatively large, which is not conducive to realization of a light and thin electronic device.

SUMMARY

Embodiments of this application provide a heat plate and an electronic device, which can resolve the problem in the related art that it is difficult to realize a light and thin electronic device due to a relatively great thickness of a heat pipe for heat dissipation.

A first aspect of the embodiments of this application provides a heat plate applied to an electronic device, including: a plurality of graphite sheets made of a graphite material or a graphene material, where the plurality of graphite sheets are arranged in a stacked manner, and a connection layer is arranged between two adjacent graphite sheets.

The heat plate provided in the embodiments of this application is formed by arranging a plurality of graphite sheets in a stacked manner, and a thermal conductivity coefficient of the material of the heat plate is high, so that the heat plate has a good heat conduction performance; because there is no need to define a cavity inside the heat plate, the heat plate can have a relatively small thickness value; and under the premise that the heat dissipation performance of the heat plate is basically the same as the heat dissipation performance of a heat pipe, the thickness of the heat plate can be less than the thickness of the heat pipe. In this way, when a heat plate is used to replace a heat pipe to assist an electronic component of an electronic device in dissipating heat, the thickness of the electronic device can also be correspondingly reduced, thereby facilitating the realization of a light and thin electronic device.

In a possible implementation, the connection layer is an adhesive layer, where two adjacent graphite sheets are bonded by the adhesive layer; or when a quantity of graphite sheets is greater than two, a plurality of connection layers are arranged, some of the plurality of connection layers are adhesive layers, and the remaining of the plurality of connection layers are metal bonding layers.

In a possible implementation, the adhesive layer is a double-sided adhesive layer made of a double-sided adhesive material; or the adhesive layer is a thermally conductive gel layer made of thermally conductive gel.

In a possible implementation, thicknesses of all of the graphite sheets are the same; or thicknesses of at least two of the plurality of graphite sheets are different.

In a possible implementation, a thickness of each part of the heat plate is the same.

In a possible implementation, a thickness of each of the graphite sheets is the same; or the heat plate includes at least two graphite sheets with uneven thicknesses, and the at least two graphite sheets with uneven thicknesses are adjacent to each other.

In a possible implementation, thicknesses of at least two parts of the heat plate are different.

In a possible implementation, the heat plate includes at least one graphite sheet with an uneven thickness.

In a possible implementation, the heat plate includes a first region and a second region that have different thicknesses, where a quantity of graphite sheets at the first region is different from a quantity of graphite sheets at the second region.

In a possible implementation, the plurality of graphite sheets includes at least a first graphite sheet and a second graphite sheet, both the first graphite sheet and the second graphite sheet are outermost layers of the heat plate in a stacked arrangement direction, a surface of the first graphite sheet facing away from the second graphite sheet is provided with bonding glue, and a surface of the second graphite sheet facing away from the first graphite sheet is provided with a polyethylene terephthalate PET film.

A second aspect of the embodiments of this application provides an electronic device, including: a middle frame, a display screen, a circuit board, a heating element, a heat conduction element, and the heat plate provided in the first aspect of the embodiments of this application, where the display screen and the circuit board are respectively arranged on two sides of the middle frame in a thickness direction of the electronic device, the heating element is arranged on the circuit board, the heating element is in contact with the middle frame through the heat conduction element, the middle frame is provided with a groove, and the heat plate is mounted in the groove.

In a possible implementation, a thickness of the heat plate is not greater than a depth of the groove; and an orthographic projection of the heat conduction element on the display screen is located within an orthographic projection of the heat plate on the display screen.

In a possible implementation, there are a plurality of heating elements, and a shape of the heat plate is adapted to a shape constructed by the plurality of heating elements.

In a possible implementation, the heat plate includes a rectangular plate body and a heat conduction plate body, and the heating elements all exactly face the heat conduction plate body; in a width direction of the electronic device, a minimum value of distances between first side edges of all the heating elements and a same side edge of the heat conduction plate body is a first distance, and a minimum value of distances between second side edges of all the heating elements and a same side edge of the heat conduction plate body is a second distance; in a direction of the electronic device, a minimum value of distances between third side edges of all the heating elements and a same side edge of the heat conduction plate body is a third distance, and a minimum value of distances between fourth side edges of all the heating elements and a same side edge of the heat conduction plate body is a fourth distance; and the first distance, the second distance, the third distance, and the fourth distance are all positive numbers.

In a possible implementation, the first distance is equal to the second distance, and the third distance is equal to the fourth distance.

In a possible implementation, the electronic device further includes a battery, where the battery is located on a side of the middle frame facing away from the display screen, the battery and the circuit board are spaced apart in a length direction of the middle frame, and a part of the battery is opposite to a part of the heat plate.

In a possible implementation, the electronic device further includes a first heat dissipation portion, where the first heat dissipation portion is located between the display screen and the heat plate, and the orthographic projection of the heat plate on the display screen is located within an orthographic projection of the first heat dissipation portion on the display screen.

In a possible implementation, the electronic device further includes a second heat dissipation portion mounted on the middle frame, where the second heat dissipation portion is located between the middle frame and the display screen, and the second heat dissipation portion and the first heat dissipation portion are spaced apart in the length direction of the middle frame.

In a possible implementation, the electronic device further includes a rear cover and a third heat dissipation portion, where the rear cover is arranged on a side of the circuit board facing away from the middle frame, and the third heat dissipation portion is arranged between the circuit board and the rear cover.

In a possible implementation, the first heat dissipation portion, the second heat dissipation portion, and the third heat dissipation portion are any one of graphite sheets, copper foil, aluminum foil, heat plates, or heat pipes.

The electronic device provided in the embodiments of this application includes a heat plate. The heat plate is formed by arranging a plurality of graphite sheets in a stacked manner, and a thermal conductivity coefficient of the material of the heat plate is high, so that the heat plate has a good heat conduction performance; because there is no need to define a cavity inside the heat plate, the heat plate can have a relatively small thickness value; and under the premise that the heat dissipation performance of the heat plate is basically the same as the heat dissipation performance of a heat pipe, the thickness of the heat plate can be less than the thickness of the heat pipe. In this way, when a heat plate is used to replace a heat pipe to assist an electronic component of an electronic device in dissipating heat, the thickness of the electronic device can also be correspondingly reduced, thereby facilitating the realization of a light and thin electronic device.

A third aspect of the embodiments of this application provides an electronic device, including: a middle frame, a display screen, a circuit board, a heating element, a heat conduction element, and the heat plate provided in the first aspect of the embodiments of this application, where the display screen and the circuit board are respectively arranged on two sides of the middle frame in a thickness direction of the electronic device, the heating element is arranged on the circuit board, the heat plate is arranged between the middle frame and the circuit board, and the heating element is in contact with the heat plate through the heat conduction element.

BRIEF DESCRIPTION OF THE DRAWINGS

FIG. 1i is a schematic cross-sectional view of another electronic device according to an embodiment of this application;

DESCRIPTION OF REFERENCE NUMERALS

100. Electronic device;

10. Display screen; 11. Foam; 11*a*. First foam; 11*b*. Second foam;

20. Middle frame; 21. Groove; 22. Overlap edge; 23. Middle plate; 24. Frame;

30. Rear cover,

40. Battery;

50. Heat sink; 51. Shielding cover; 52. Thermally conductive gel; 53. heat plate; 530. Graphite sheet; 531; Adhesive layer; 532. Polyethylene terephthalate PET film; 533. Copper foil layer; 534. Rectangular plate body; 535. Heat conduction plate body;

54. First heat dissipation portion; 55. Second heat dissipation portion; 56. Third heat dissipation portion;

60. Circuit board; 61. Heating element.

DETAILED DESCRIPTION OF ILLUSTRATIVE EMBODIMENTS

To improve the performance of an electronic device 100*a*, an increasing number of electronic components 61*a* with high power consumption are integrated on the electronic device 100*a*. These electronic components 61*a* will generate a lot of heat during working, and the heat is concentrated in the electronic device 100*a* and difficult to be dissipated, causing the temperature of the electronic device 100*a* to rise. Therefore, how to overcome the temperature rise is a problem to be urgently resolved for the electronic device 100*a*.

Figure 1:
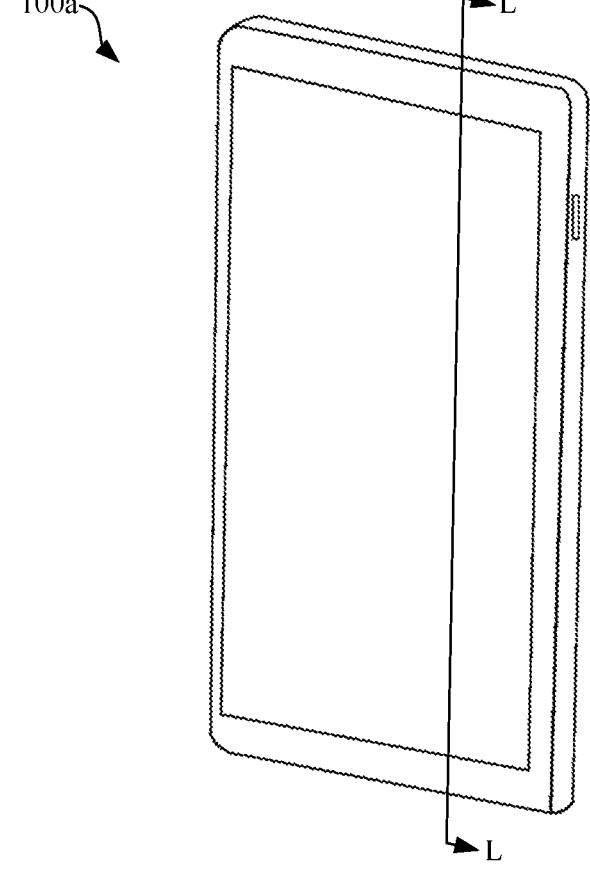
FIG. 1 is a schematic structural diagram of an electronic device in the related art.
Figure 2:
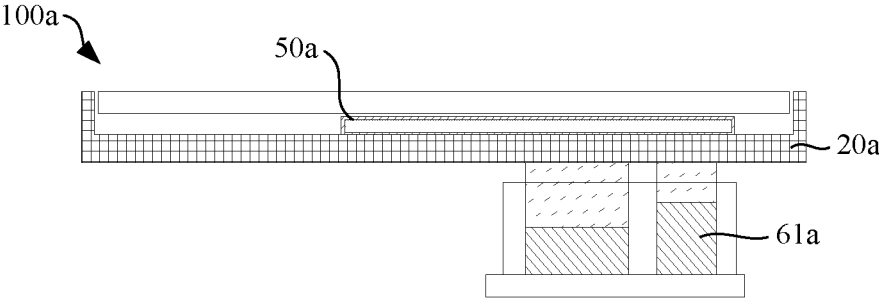
FIG. 2 is a schematic cross-sectional view of the electronic device shown in FIG. 1 taken in an L-L direction.
Figure 3:
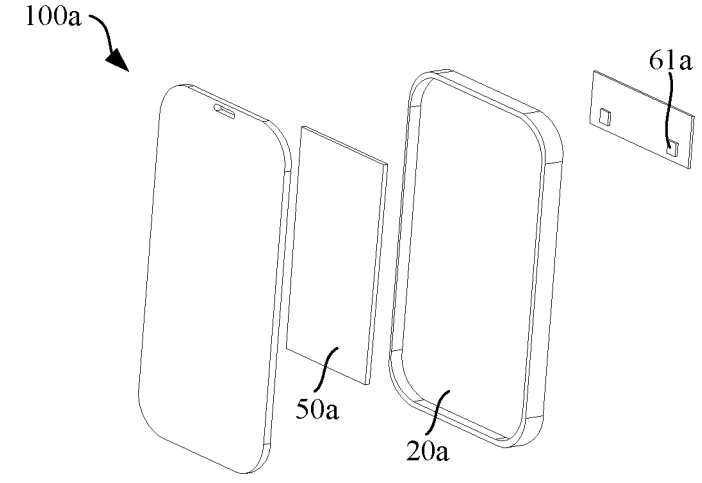
FIG. 3 is a schematic exploded diagram of an electronic device in the related art.

Some examples in the related art provide a heat pipe 50*a*. As shown in FIG. 1 to FIG. 3, the heat pipe 50*a* is arranged on a middle frame 20*a* of the electronic device 100*a*, and the heat pipe 50*a* has a cavity inside. The cavity is filled with a liquid medium such as water or liquid nitrogen. One end of the heat pipe 50*a* is an evaporation end, and an other end of the heat pipe 50*a* is a condensation end. The heat dissipation principle of the electronic device 100*a* with the heat pipe 50*a* is generally as follows: The heat generated by the electronic components 61*a* on the electronic device 100*a* is transferred to the evaporation end of the heat pipe 50*a*; the liquid medium inside the evaporation end of the heat pipe 50*a* absorbs the heat and then evaporates to form vapor, the vapor diffuses to the condensation end of the heat pipe 50*a* and releases heat; and the vapor that has released the heat re-condenses into a liquid when it is cooled and flows back to the evaporation end. The process is repeated, so that the heat generated by the electronic components 61*a* is dissipated to the environment in which the heat pipe 50*a* is located, thereby achieving cooling.

Another example in the related art provides a vapor chamber (Vapor Chamber, VC). The vapor chamber is arranged on the middle frame 20*a* of the electronic device 100*a*, and the vapor chamber is also provided with a cavity for containing liquid media such as water or liquid ammonia inside. The heat dissipation principle of the vapor chamber is similar to the heat dissipation principle of the heat pipe 50*a*, which will not be described herein again. The difference between the vapor chamber and the heat pipe 50*a* is that the liquid medium in the vapor chamber flows along a plane, and a heat conduction area of the vapor chamber is larger than a heat conduction area of the heat pipe 50*a*, so that the heat dissipation efficiency of the vapor chamber is higher.

It can be seen that each of the heat pipe 50*a* and the vapor chamber is provided with a cavity for a liquid medium to flow inside, and the heat transfer and heat dissipation are realized by a phase change of the liquid medium. However, both the thickness of the heat pipe 50*a* and the thickness the vapor chamber cannot be excessively small due to the cavity formed inside. For example, the minimum thickness of the heat pipe 50*a* can only reach 0.35 mm at present, and the minimum thickness of the vapor chamber can only reach 0.4 mm at present, which causes the electronic device 100*a* that mainly uses the heat pipe 50*a* or the vapor chamber to conduct the heat of the electronic components 61*a* to be difficult to be light and thin. In addition, the manufacturing processes of the heat pipe 50*a* and the vapor chamber are complex, and the manufacturing costs thereof are high, which further leads to a relatively high cost of the electronic device 100*a* having the heat pipe 50*a* and/or the vapor chamber. In addition, it can also be understood that both the heat pipe 50*a* and the vapor chamber need to be configured to have an evaporation end and a condensation end, the heat conduction path of the heat pipe 50*a* is linear, and the heat conduction path of the vapor chamber extends in one direction. Both the heat pipe 50*a* and the vapor chamber are difficult to be constructed in an arc shape or other irregular shapes, and consequently it is difficult for the heat pipe 50*a* to be adapted to heating elements arranged in various manners.

In view of the foregoing problem, the designer of this application attempted to design a heat plate to conduct heat of an electronic device. The heat plate is made of a material with a high thermal conductivity coefficient, and the heat plate has a large heat conduction area. In this way, the heat plate can have good heat dissipation performance. Subsequently, the designer of this application found that the graphite material has a high thermal conductivity coefficient, and then conceived of using a plurality of graphite sheets to construct the heat plate. In this way, when the heat dissipation performance of the heat plate can be kept equivalent to the heat dissipation performance of the heat pipe, the thickness of the heat plate can be less than the thickness of the heat pipe, so that the electronic device with a heat plate can be lighter and thinner.

The following describes implementations provided in the embodiments of this application in detail:

Embodiment 1

An embodiment of this application provides an electronic device 100. The electronic device 100 may include, but not limited to, a mobile phone, a tablet computer, a notebook computer, an ultra-mobile personal computer (ultra-mobile personal computer, UMPC), a handheld computer, an inter-phone, a netbook, a POS machine, a personal digital assistant (personal digital assistant, PDA), a wearable device, a virtual reality device, or another mobile or fixed terminal with a battery 40.

Figure 4:
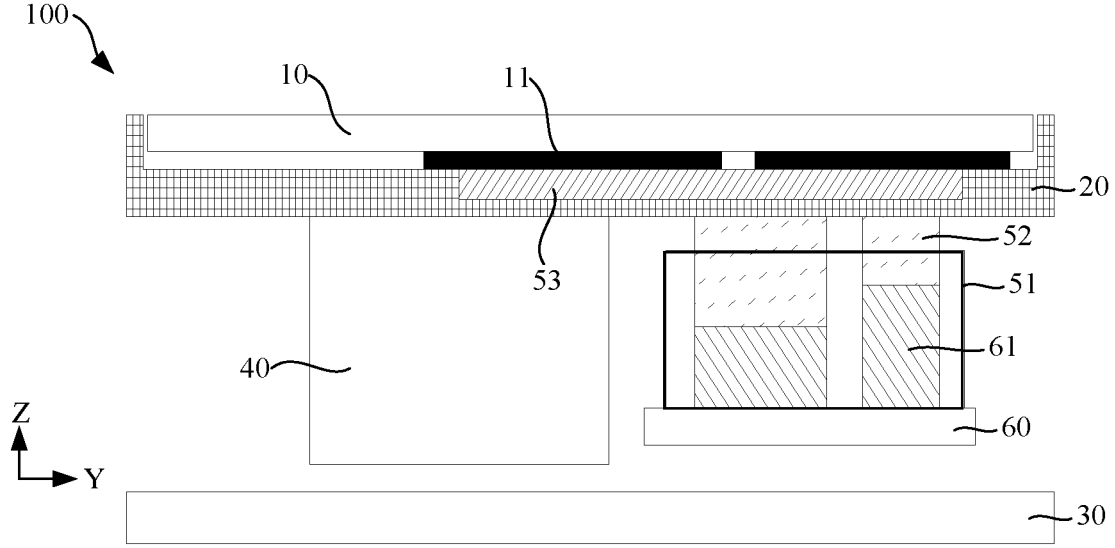
FIG. 4 is a schematic cross-sectional view of an electronic device according to an embodiment of this application.
Figures 5, 6:
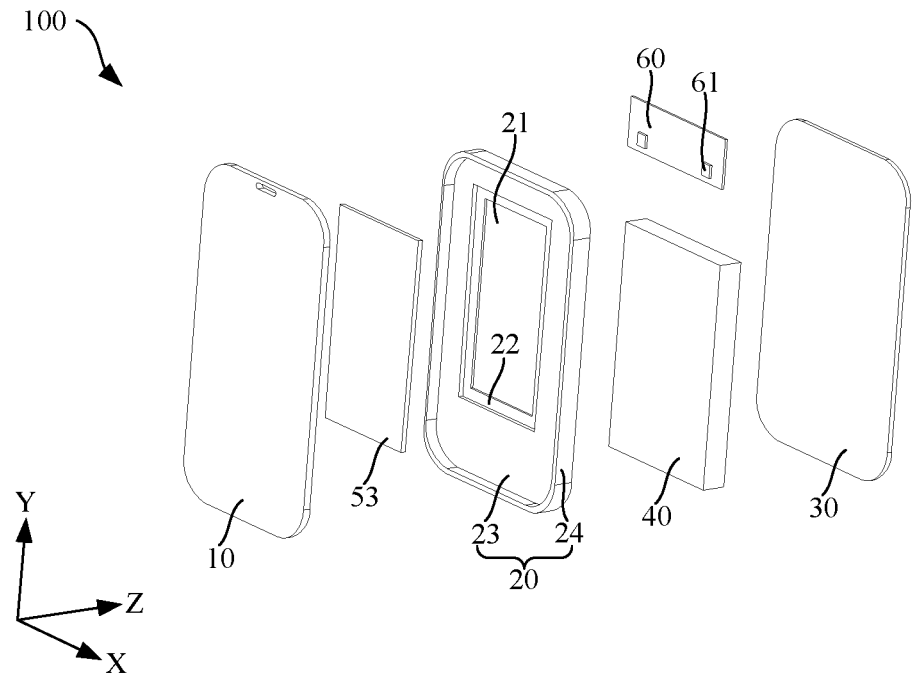
FIG. 5 is a schematic exploded diagram of an electronic device when a heat plate is in a first shape according to an embodiment of this application.
FIG. 6 is a schematic diagram of a first heat plate in an electronic device according to an embodiment of this application.

FIG. 4 is a cross-sectional view of an electronic device 100 taken in a direction of a reference line L-L in FIG. 1 according to this embodiment. Referring to FIG. 4 and FIG. 5, in this embodiment of this application, the electronic device 100 includes a display screen 10, a middle frame 20, a circuit board 60, a heating element 61 and a heat conduction element, and the middle frame 20 can be used to carry the display screen 10 and the circuit board 60. The display screen 10 and the circuit board 60 are respectively arranged on two sides of the middle frame 20 in a thickness direction of the electronic device 100, the heating element 61 is arranged on the circuit board 60, and the heating element 61 is in contact with the middle frame 20 through the heat conduction element. It should be noted that, in the accompanying drawings of the embodiments of this application, directions of an X-axis, a Y-axis, and a Z-axis respectively represent a width direction, a length direction, and a thickness direction of the electronic device 100.

In FIG. 5, the middle frame 20 may specifically include a middle plate 23 and a frame 24 connected to a circumferential edge of the middle plate 23. The frame 24 protrudes toward a side at which the display screen 10 is located. The middle plate 23 and the frame 24 jointly form an accommodating space.

As an electronic component of the electronic device 100, the heating element 61 may be one or more of a power amplifier, an application processor (Central Processing Unit, CPU), a power management chip (Power Management IC, PMIC), a universal flash storage (Universal Flash Storage, UFS), a charging chip, an external baseband, and an image processing chip (Image Signal Processor, ISP). The power amplifier herein may be a 4G PA and a 5G PA.

Figure 23:
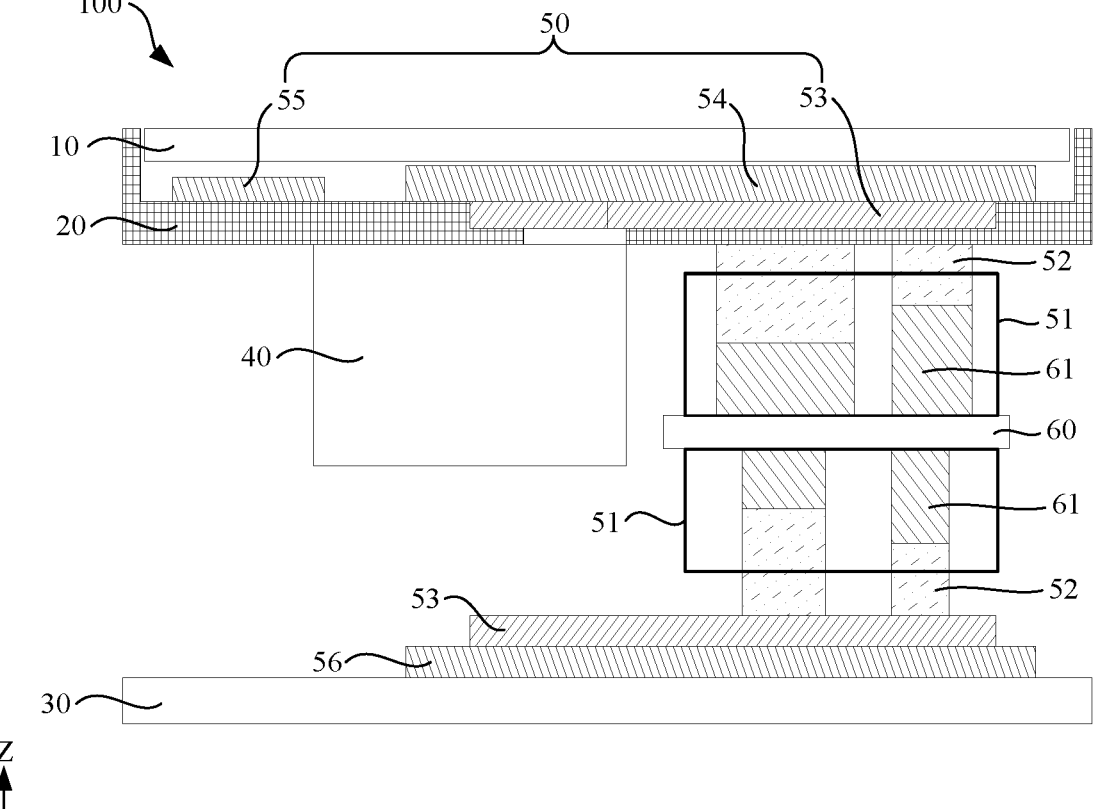
FIG. 23 is a schematic cross-sectional view of yet another electronic device according to an embodiment of this application.

When the electronic device 100 has the foregoing several heating elements 61, the electronic device 100 can realize more functions. In this case, a plurality of heating elements 61 are arranged. The plurality of heating elements 61 may all be arranged on a first surface of the circuit board 60, or the plurality of heating elements 61 are respectively arranged on the first surface and a second surface of the circuit board 60 (for example, as shown in FIG. 23). Herein, the first surface refers to a surface of the circuit board 60 facing the display screen 10, and on the contrary, the second surface refers to a surface of the circuit board 60 facing away from the display screen 10.

For example, the electronic device 100 may have three heating elements 61: a CPU, a PMIC, and a 5G PA. In this case, the layout of the three heating elements 61 includes, but is not limited to, the following possible situations: In the first situation, the CPU, the PMIC, and the 5G PA are all arranged on the first surface of the circuit board 60; in the second situation, the CPU and the PMIC are arranged on the first surface of the circuit board 60, and the 5G PA is arranged on the second surface of the circuit board 60; and in the third case, the CPU is arranged on the first surface of the circuit board 60, and the PMIC and the 5G PA are arranged on the second surface of the circuit board 60. It can be seen that, when a plurality of heating elements 61 are arranged, one or more heating elements 61 may be mounted on the first surface of the circuit board 60.

Specifically, the electronic device 100 further includes a shielding cover 51. The shielding cover 51 is connected to the circuit board 60, and the shielding cover 51 and the circuit board 60 jointly form a shielding space. The heating element 61 is accommodated in the shielding space. In this way, the shielding cover 51 can prevent the heating element 61 from being interfered by an external electromagnetic field. If both the first surface and the second surface of the circuit board 60 are provided with heating elements 61, correspondingly, both the first surface and the second surface of the circuit board 60 may be connected to a shielding cover 51. It is to be noted that, the shielding cover 51 may be a heat conduction element. In this case, the heating element 61 transfers heat to the circuit board 60, then the circuit board 60 conducts the heat to the shielding cover 51 connected to the circuit board 60, and subsequently the shielding cover 51 transfers the heat to the middle frame 20. The shielding cover 51 may be a metal shielding cover made of a metal material, and the metal shielding cover 51 has a strong heat conduction capability.

In some embodiments, as shown in FIG. 4, the heat conduction element may further include thermally conductive gel 52, and the heating element 61 transfers heat to the middle frame 20 through the thermally conductive gel 52. Specifically, for a heating element 61 located on the first surface, the heating element 61 and the shielding cover 51 are connected by the thermally conductive gel 52, and the shielding cover 51 and the middle frame 20 are connected by the thermally conductive gel 52, and some heat generated by the heating element 61 can be conducted to the middle frame 20 through the thermally conductive gel 52. In addition, when a plurality of heating elements 61 are arranged on the circuit board 60, there is thermally conductive gel between each heating element and the shielding cover 51.

The electronic device 100 further includes a heat plate 53. The heat plate 53 is configured to assist the electronic device 100 in heat dissipation.

As shown in FIG. 6, the heat plate 53 may be mainly formed by a plurality of graphite sheets 530. The graphite sheets 530 may be made of a graphite material, or may be made of a graphene material. Both graphite and graphene have advantages such as low density and relatively high thermal conductivity, so that heat plate 53 has relatively good heat conduction performance. Specifically, the thermal conductivity coefficient of graphene is as high as 1300 W/m*K.

The plurality of graphite sheets 530 in the heat plate 53 are arranged in a stacked manner in one direction, and two adjacent graphite sheets 530 are connected by a connection layer, so that the plurality of graphite sheets 530 form a whole. It may be understood that in the direction in which the graphite sheets 530 are arranged in a stacked manner, the plurality of graphite sheets 530 includes at least a first graphite sheet and a second graphite sheet. Both the first graphite sheet and the second graphite sheet are outermost layers of the heat plate 53. In addition, when the heat plate 53 is mounted on the electronic device 100, a surface of the first graphite sheet facing away from the second graphite sheet is in contact with the electronic device 100.

For example, in FIG. 6, when there are two graphite sheets 530, the heat plate 53 includes a first graphite sheet and a second graphite sheet, and the first graphite sheet and the second graphite sheet are adjacent to each other. In this case, the heat plate 53 has only one connection layer.

Figure 7:
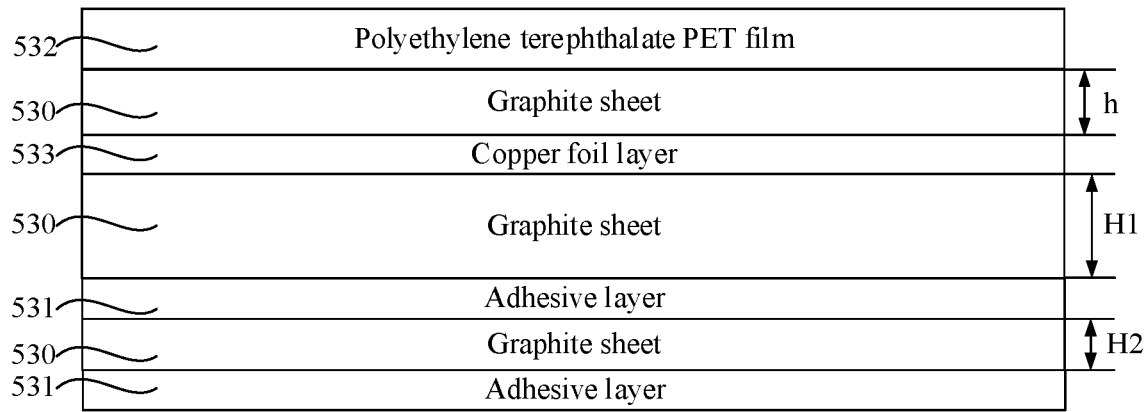
FIG. 7 is a schematic diagram of a second heat plate in an electronic device according to an embodiment of this application.

In another example, as shown in FIG. 7, when there are at least three graphite sheets 530, the heat plate 53 includes a first graphite sheet, a second graphite sheet, and at least one intermediate graphite sheet, and the intermediate graphite sheet is located between the first graphite sheet and the second graphite sheet. In this case, the heat plate 53 has a plurality of connection layers. The quantity of connection layers is less than the quantity of graphite sheets 530, and a difference between the quantity of connection layers and the quantity of graphite sheets 530 is one. Specifically, if the heat plate 53 has three graphite sheets 530, the heat plate 53 includes a first graphite sheet, a second graphite sheet, and an intermediate graphite sheet, and there is a connection layer between the intermediate graphite sheet and each of the first graphite sheet and the second graphite sheet. If the heat plate 53 has four graphite sheets 530, the heat plate 53 includes a first graphite sheet, a second graphite sheet, and two intermediate graphite sheets, a connection layer is arranged between each of the first graphite sheet and the second graphite sheet and an adjacent intermediate graphite sheet, and a connection layer is arranged between the two intermediate graphite sheets. The rest is deduced by analogy.

Referring to FIG. 4 and FIG. 5, the middle plate 23 of the middle frame 20 is provided with a second groove 21, and the heat plate 53 is mounted in the groove 21. It may be understood that when the heat plate 53 is mounted in the groove 21, the first graphite sheet of the heat plate 53 is in contact with a bottom wall of the groove 21. When bonding glue is provided on a surface of the first graphite sheet facing away from the second graphite sheet, the heat plate 53 is bonded to the middle frame 20.

An exemplary heat dissipation principle of the electronic device 100 provided in this embodiment is as follows: When the electronic device 100 is working, heat generated by the heating element 61 is transferred to the middle frame 20 through the thermally conductive gel 52, and then the middle frame 20 transfers the heat to the heat plate 53 arranged on the middle frame 20, so that the heat is dissipated in the accommodating space instead of gathering in the shielding space, which helps to avoid overheating of the heating element 61 due to incapability to dissipate the heat, thereby helping to resolve the problems of performance reduction and life shortening of the heating element 61 due to an excessive temperature rise.

An exemplary working principle of the heat plate 53 applied to the electronic device 100 is as follows: An electronic component on the electronic device 100 transfers heat to the first graphite sheet of the heat plate 53, and then the heat is transferred to a graphite sheet 530 adjacent to the first graphite sheet, until the heat is transferred to the second graphite sheet, so that the heat is dissipated to the environment in which the heat plate 53 is located inside the electronic device 100, which helps to prevent the heat generated by the electronic component from being concentrated and causing an excessive temperature rise thereof, thereby realizing heat dissipation.

The heat plate 53 provided in this embodiment is formed by arranging a plurality of graphite sheets 530 in a stacked manner, and a thermal conductivity coefficient of the material of the heat plate 53 is high, so that the heat plate 53 has a good heat conduction performance; and because there is no need to define a cavity inside the heat plate 53, the heat plate 53 can have a relatively small thickness value. It is found through simulation experiments that when the quantity and the thicknesses of graphite sheets 530 in the heat plate 53 are designed under the premise that the heat dissipation performance of the heat plate 53 is basically the same as the heat dissipation performance of a heat pipe, the thickness of the heat plate 53 can be less than the thickness of the heat pipe. In this way, when the heat plate 53 is used to replace a heat pipe to assist an electronic component of the electronic device 100 in dissipating heat, the thickness of the electronic device 100 can also be correspondingly reduced, thereby facilitating the realization of a light and thin electronic device.

It can also be found through simulation experiments that if the quantity and the thicknesses of graphite sheets 530 in the heat plate 53 are properly designed, when the heat dissipation performance of the heat plate 53 can reach 60% to 80% of the heat dissipation performance of the heat plate, due to the low cost of the graphite material, the manufacturing cost of the heat plate 53 is much lower than the cost of the vapor chamber. That is, the heat plate 53 has a cost advantage when compared with the vapor chamber in the related art, thereby helps to reduce the cost of the electronic device 100 to which the heat plate 53 is applied.

In addition, when the heat plate 53 is formed by a single graphite sheet, the thickness of the single graphite sheet needs to be configured to be relatively great, so that the heat plate 53 can have good heat dissipation performance. In this case, because the graphite sheet 530 is manufactured through a sintering process, it is difficult to sinter the single graphite sheet with a relatively thickness, resulting in poor performance of the graphite sheet 530. In this embodiment, by setting the heat plate 53 as a plurality of graphite sheets 530 arranged in a stacked manner, under the premise that the heat conduction performance of the heat plate 53 is basically the same, the thickness of each of the plurality of graphite sheets 530 may be designed to be less than the thickness of the single graphite sheet, so that the sintering difficulty of each graphite sheet 530 is reduced, and the manufacturing thereof is less difficult.

Still referring to FIG. 6 and FIG. 7, in some embodiments, the connection layer may be an adhesive layer 531. In this embodiment, regardless of whether the heat plate 53 includes two graphite sheets 530 or at least three graphite sheets 530, any two adjacent graphite sheets 530 may be bonded together by an adhesive layer 531, and the connection manner is simple. Specifically, the material of the adhesive layer 531 may be double-sided adhesive, and in this case, the adhesive layer 531 is a double-sided adhesive layer. Alternatively, the material of the adhesive layer 531 may be thermally conductive gel, and in this case, the adhesive layer 531 is a thermally conductive gel layer. When the adhesive layer 531 is a thermally conductive gel layer made of thermally conductive gel, compared with the double-sided adhesive layer, the thermally conductive gel layer not only plays the role of bonding, but also can transfer heat, so that the heat can be quickly transferred from the first graphite sheet to the second graphite sheet, thereby helping to improve the heat conduction capability of the heat plate 53.

In an alternative embodiment, the connection layer may alternatively include an adhesive layer and a metal bonding layer. This embodiment is applicable to a situation in which the heat plate 53 includes at least three graphite sheets 530. In this case, the heat plate 53 has a plurality of connection layers, and at least one of the plurality of connection layers is an adhesive layer, and the other connection layers are metal bonding layers. In other words, at least two adjacent graphite sheets 530 in the plurality of graphite sheets 530 may be connected by a metal bonding layer, and the remaining graphite sheets 530 in the plurality of graphite sheets 530 may be connected by an adhesive layer. Based on this arrangement, the metal bonding layer has a strong heat conduction capability because the material thereof is metal, so that the metal bonding layer can quickly conduct received heat, and then the heat plate 53 can quickly absorb the heat and transfer the heat to the surrounding environment, thereby helping to improve the heat dissipation effect. The metal bonding layer may be a copper foil layer 533 or an aluminum foil layer.

In the example shown in FIG. 7, the heat plate 53 includes a first graphite sheet, an intermediate graphite sheet, and a second graphite sheet arranged sequentially from bottom to top. In this example, there is a connection layer between the first graphite sheet and the intermediate graphite sheet, and there is also a connection layer between the second graphite sheet and the intermediate graphite sheet. One of the two connection layers is an adhesive layer, and the other is a copper foil layer 533 or an aluminum foil layer.

When the heat plate 53 has four graphite sheets 530, the heat plate 53 includes a first graphite sheet, a second graphite sheet, and two intermediate graphite sheets, and the heat plate 53 has three connection layers. For example, one of the three connection layers may be an adhesive layer, and the other two connection layers may be metal bonding layers. Specifically, if the connection layer between the first graphite sheet and an intermediate graphite sheet is an adhesive layer, then the connection layer between two adjacent intermediate graphite sheets and the connection layer between the second graphite sheet and an intermediate graphite sheet are metal bonding layers. Alternatively, one of the three connection layers may be a metal bonding layer, and the other two connection layers may be adhesive layers.

In addition, in the examples shown in FIG. 6 and FIG. 7, bonding glue may be provided on a surface of the first graphite sheet facing away from the second graphite sheet, so that the first graphite sheet is bonded to the electronic device 100 through the bonding glue, to cause the heat plate 53 to be bonded to the electronic device 100. A polyethylene terephthalate PET film 532 may be provided on a surface of the second graphite sheet facing away from the first graphite sheet. In this way, the polyethylene terephthalate PET film 532 can protect the second graphite sheet, to prevent slags from falling off the second graphite sheet. Based on this, when the heat plate 53 is applied to the electronic device 100, the polyethylene terephthalate PET film 532 can prevent slags from falling off the second graphite sheet and avoid electric leakage in the electronic device 100, so as to play the role of insulation.

The thicknesses of the graphite sheet 530, the connection layer, the bonding glue, and the polyethylene terephthalate PET film 532 are properly designed, so that under the premise that the heat dissipation performance of the heat plate 53 is equivalent to the heat dissipation performance of the heat pipe, the minimum thickness of the heat plate 53 can be less than the minimum thickness of the heat pipe. The thickness of the connection layer may be between 1 μm and 10 μm. Similarly, the thicknesses of the bonding glue and the polyethylene terephthalate PET film 532 may also be between 5 μm and 15 μm.

For example, in this embodiment, the thickness of each graphite sheet 530 ranges from 0.07 mm to 0.2 mm. For example, the thickness of each graphite sheet 530 may be 0.07 mm, or the thickness of each graphite sheet 530 may be 0.1 mm, 0.15 mm, or 0.2 mm.

In some embodiments, the thicknesses of the plurality of graphite sheets 530 forming the heat plate 53 may all be the same. In other words, each graphite sheet 530 has a same thickness. For example, in FIG. 6, the thickness of each graphite sheet 530 is h (0.07 mm≤h≤0.2 mm). In this case, if h is 0.07 mm and the thickness of the connection layer is 5 μm, the thickness of the heat plate 53 formed by four graphite sheets 530 is less than the minimum thickness of the heat pipe.

Certainly, in other embodiments, thicknesses of at least two of the plurality of graphite sheets 530 may be different. That is, the thicknesses of the plurality of graphite sheets 530 forming the heat plate 53 may be partially or completely different.

The thicknesses of the plurality of graphite sheets 530 forming the heat plate 53 are partially different. For example, when the heat plate 53 includes three graphite sheets 530, any two of the three graphite sheets 530 have a same thickness, and the remaining one of the three graphite sheets 530 has a thickness different from the thickness of the other two graphite sheets.

The thicknesses of the plurality of graphite sheets 530 forming the heat plate 53 are completely different. For example, in FIG. 7, the heat plate 53 includes three graphite sheets 530, and the three graphite sheets 530 are respectively a first graphite sheet, an intermediate graphite sheet, and a second graphite sheet from bottom to top. The thickness of second graphite sheet is h, the thickness of the intermediate graphite sheet is H1, and the thickness of the first graphite sheet is H2, where h, H1, and H2 all range from 0.07 mm to 0.2 mm. The magnitude relationship between h, H1, and H2 may be H2<H1<h, then the thickness of each graphite sheet 530 increases sequentially from bottom to top; or the magnitude relationship may be h<H1<H2, then the thickness of each graphite sheet 530 decreases sequentially from bottom to top; or the magnitude relationship may be H2<h<H1, then the thickness of the intermediate graphite sheet is the greatest. Examples are not given one by one again in this embodiment.

It may be understood that if the thickness of each graphite sheet 530 is the same, only one specification of graphite sheet 530 needs to be produced during processing, which is convenient for processing and manufacturing. If the thickness of each graphite sheet 530 is not completely the same, by adjusting the thickness of each graphite sheet 530, the thickness of the heat plate 53 can be adjusted flexibly, so that the thickness of the heat plate 53 can be increased as much as possible based on that the thickness of the heat plate 53 does not exceed the thickness of the heat pipe, thereby helping to improve the heat dissipation performance of the heat plate 53.

Through a proper design, the thickness of the heat plate 53 may be greater than or equal to 0.2 mm and less than or equal to 0.4 mm. In this case, when the thickness of the heat plate 53 reaches an optimal thickness value, the electronic device 100 to which the heat plate 53 is applied can also have a preferable thickness. It is to be noted that, the quantity of graphite sheets 530 needs to be properly set according to the thickness of each graphite sheet 530 and the total thickness of the heat plate 53. For example, when the thickness of each graphite sheet 530 is the minimum thickness value (that is, 0.07 mm), the heat plate 53 can include at most five graphite sheets 530, to prevent the thickness of the heat plate 53 from exceeding 0.4 mm. In addition, when the thickness of one graphite sheet 530 in the heat plate 53 is the maximum thickness value (that is, 0.2 mm), the thicknesses of the remaining graphite sheets 530 of the heat plate 53 are less than 0.2 mm, and the thickness of the heat plate 53 exceeds 0.2 mm.

Figure 8:
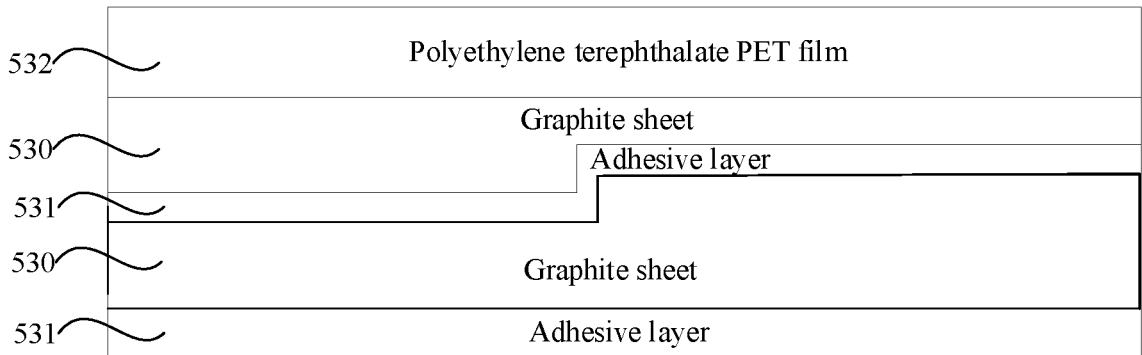
FIG. 8 is a schematic diagram of a third heat plate in an electronic device according to an embodiment of this application.

In addition, the heat plate 53 may be constructed as that the thickness of each part is a uniform value. That is, each part of the heat plate 53 has a same thickness, so that the surface of the heat plate 53 is formed as a flat surface. There are the following possible implementations in this embodiment: Referring to FIG. 6, the first implementation is that the thickness of each part of each graphite sheet 530 forming the heat plate 53 may be the same. Referring to FIG. 8, the second implementation is that at least two of the plurality of graphite sheets 530 forming the heat plate 53 have uneven thicknesses, and the at least two graphite sheets 530 with uneven thicknesses are adjacent to each other, provided that the total thickness of parts of the heat plate 53 is the same.

Specifically, in the second implementation, an example in which the heat plate 53 has two graphite sheets 530 is used. The heat plate 53 includes a first graphite sheet and a second graphite sheet. The first graphite sheet may include a first part and a second part, and a thickness of the first part is less than a thickness of the second part. The second graphite sheet may include a third part and a fourth part, and a thickness of the third part is greater than a thickness of the fourth part. In addition, when the first graphite sheet is connected to the second graphite sheet, the third part exactly faces the first part, the fourth part exactly faces the second part, and a sum of the thicknesses of the third part and the first part is equal to a sum of the thicknesses of the fourth part and the second part, so that the thickness of the heat plate 53 formed by the two graphite sheets 530 is even. In this embodiment, both the first graphite sheet and the second graphite sheet are in a step shape.

Alternatively, in some embodiments, the heat plate 53 may alternatively be constructed as that the thickness value of each part is not uniform. That is, each part of the heat plate 53 has a different thickness.

Figure 9:
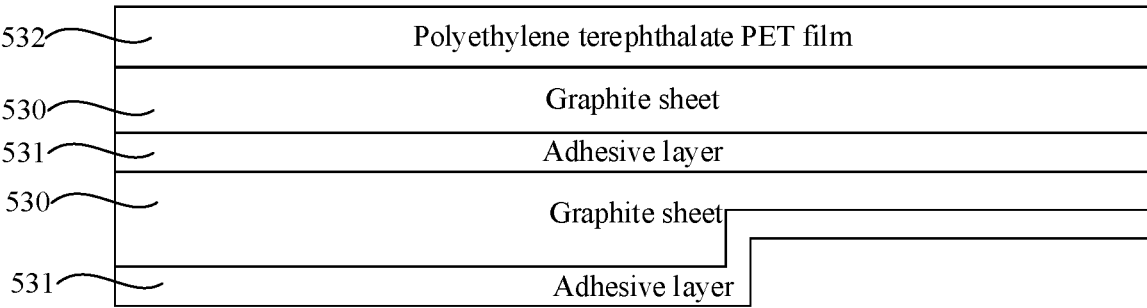
FIG. 9 is a schematic diagram of a fourth heat plate in an electronic device according to an embodiment of this application.

In a possible implementation, referring to FIG. 9, the heat plate 53 has at least one graphite sheet 530 with an uneven thickness. For example, in the example shown in FIG. 9, the heat plate 53 includes a first graphite sheet and a second graphite sheet that are sequentially arranged in a stacked manner from bottom to top. The thickness of the second graphite sheet is even, and the thickness of the first graphite sheet is uneven, so that the thickness of the heat plate 53 formed by the first graphite sheet and the second graphite sheet is uneven.

Figures 10, 11:
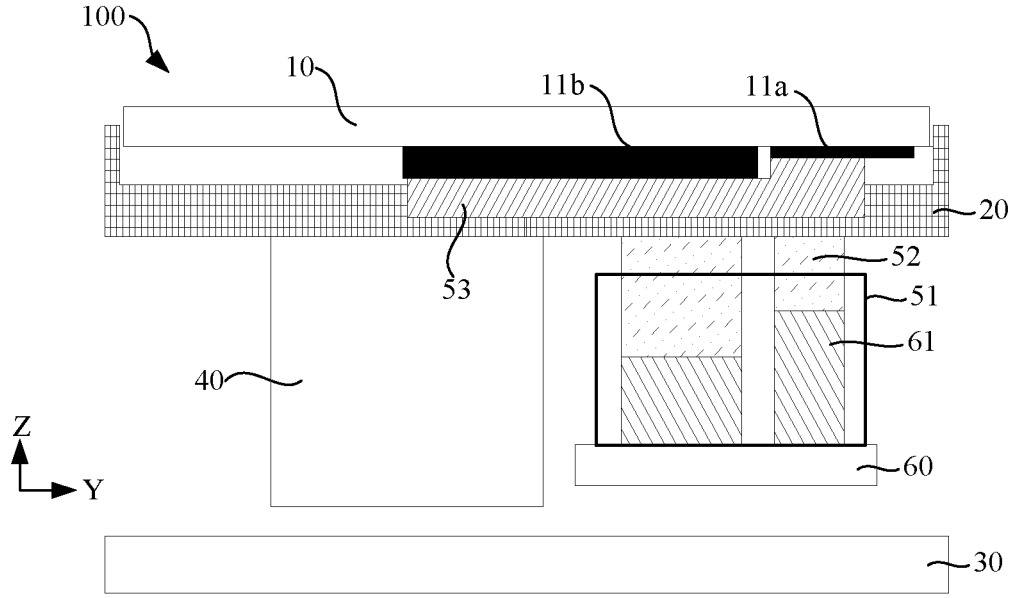
FIG. 10 is a schematic diagram of a fifth heat plate in an electronic device according to an embodiment of this application.

In another possible implementation, referring to FIG. 10, the heat plate 53 includes a first region and a second region, and the thickness of the first region is different from the thickness of the second region. In addition, the quantity of graphite sheets 530 at the first region is different from the quantity of graphite sheets at the second region. For example, in the example shown in FIG. 10, the heat plate 53 includes a first graphite sheet and a second graphite sheet that are sequentially arranged in a stacked manner from bottom to top. In a thickness direction of the heat plate, a cross-sectional area of the first graphite sheet is smaller than a cross-sectional area of the second graphite sheet, and the first graphite sheet is designed as that an orthographic projection thereof on the middle plate 23 partially overlaps with an orthographic projection of the second graphite sheet on the middle plate 23, so that the heat plate 53 has two layers of graphite sheets at a region at which the first graphite sheet and the second graphite sheet overlap, and has only one layer of graphite sheet at a region at which the first graphite sheet and the second graphite sheet do not overlap, thereby realizing different thicknesses of at least two parts of the heat plate 53. It is to be noted that, in this embodiment, the thickness of each graphite sheet 530 forming the heat plate 53 is even.

Certainly, the heat plate 53 may also include a plurality of regions with different thicknesses, and the quantities of graphite sheets at the plurality of regions are different, so that the thicknesses of plurality of parts of the heat plate 53 are different.

It may be understood that when the heat plate 53 includes at least three graphite sheets 530, the heat plate 53 includes a first graphite sheet, an intermediate graphite sheet, and a second graphite sheet that are sequentially arranged in a stacked manner from bottom to top. The first graphite sheet or the second graphite sheet is configured to overlap with only a partial region of the intermediate graphite sheet. In other words, by designing any one of the outermost graphite sheets 530 of the heat plate 53 to have a cross-sectional area smaller than a cross-sectional area of the intermediate graphite sheet, the heat plate 53 has two regions with different thicknesses, thereby realizing an uneven thickness of the heat plate 53. In addition, this arrangement can also maintain good stability of the entire heat plate 53.

A surface of the display screen 10 facing the middle plate 23 is connected to a plurality of pieces of foam 11, and thicknesses of the plurality of pieces of foam 11 may be the same or different. Therefore, by designing the heat plate 53 to be equal or not equal in thickness, the thickness of the heat plate 53 can be adapted to the thickness of the foam 11, then the heat plate 53 is in contact with a surface of each of the plurality of pieces of foam 11 facing away from the display screen 10, and then a contact area between the heat plate 53 and the foam 11 can be maximized, thereby helping to ensure good stability of the display screen 10.

Specifically, in FIG. 4, a surface of the display screen 10 facing the middle plate 23 is connected to a plurality of pieces of foam 11, and the plurality of pieces of foam 11 have a same thickness. Correspondingly, the thickness of each part of the heat plate 53 is the same. In this way, the surfaces of the plurality of pieces of foam 11 facing the heat plate 53 are flat surfaces, and the surface of the heat plate 53 facing the display screen 10 is also a flat surface.

In FIG. 11, the surface of the display screen 10 facing the middle plate 23 is connected to first foam 11a and second foam 11b, and a thickness of the first foam 11a is less than a thickness of the second foam 11b. Correspondingly, a thickness of a part on the heat plate 53 opposite to the first foam 11a is greater than a thickness of a part on the heat plate 53 opposite to the second foam 11b.

In some embodiments, the thickness of the heat plate 53 is not greater than a depth of the groove 21. That is, the thickness of the heat plate 53 is less than the depth of the groove 21, or the thickness of the heat plate 53 is the same as the depth of the groove 21. In this case, the surface of the heat plate 53 facing away from the circuit board 60 and the surface of the middle plate 23 facing away from the circuit board 60 are coplanar. With such a design, the heat plate 53 does not extend from the groove 21 into the accommodating space, which helps to prevent a part of the heat plate 53 from occupying the accommodating space and resulting in reduction of the accommodating space. Therefore, the accommodating space can be configured to accommodate more or larger electronic components or components.

The display screen 10 has a front surface and a back surface. The front surface is a surface of the display screen 10 facing a user, and the back surface is a surface of the display screen 10 facing away from the user. Referring to FIG. 4, in some embodiments of this application, orthographic projections of the heat conduction element and the heating element 61 on the back surface of the display screen 10 in a direction perpendicular to the middle plate 23 fall within an orthographic projection of the heat plate 53 on the back surface of the display screen 10. That is, the heating element 61 and the heat plate 53 are oppositely located on two sides of the middle frame 20. With such a design, when the middle frame 20 transfers heat emitted by the heating element 61 to the heat plate 53, a heat transfer path between the middle frame 20 and the heat plate 53 is the shortest, so that the heat generated by the heating element 61 can be quickly transferred to the heat plate 53, thereby helping to improve the cooling rate of the heating element 61.

The shapes of the groove 21 and the heat plate 53 are not limited. For example, both the groove 21 and the heat plate 53 may be rectangular. Preferably, when a plurality of heating elements 61 are arranged on the first surface of the circuit board 60, the shape of the heat plate 53 is properly designed according to the layout manner of the plurality of heating elements 61, so that orthographic projections of the plurality of heating elements 61 arranged on the first surface of the circuit board 60 on the back surface of the display screen 10 can all be within the orthographic projection of the heat plate 53 on the back surface of the display screen 10.

In some examples, the heat plate 53 may include a rectangular plate body 534 and a heat conduction plate body 535. The shape of the heat conduction plate body 535 is adapted to the shape constructed by the heating elements 61 arranged on the first surface of the circuit board 60, so that projections of the heating elements 61 on the heat plate 53 are all located on the heat conduction plate body 535. Based on this arrangement, a heat transfer path between each heating element 61 arranged on the first surface of the circuit board 60 and the heat plate 53 can be the shortest, so that the heat generated by these heating elements 61 can all be quickly conducted to the heat plate 53, thereby making the heating element 61 dissipate heat quickly. In addition, compared with directly arranging a heat plate 53 with a relatively large size, the heat plate 53 in this embodiment is provided with a heat conduction plate body 535 adapted to the heating elements 61. On the basis of corresponding to these heating elements 61, the size of the heat plate 53 can be reduced as much as possible, and then the size of the groove 21 can also be made as small as possible, so as to help to prevent the groove 21 from being excessively large and causing insufficient structural strength of the middle frame 20, thereby ensuring that the middle frame 20 can stably carry components such as the circuit board 60 and the display screen 10.

Figure 14:
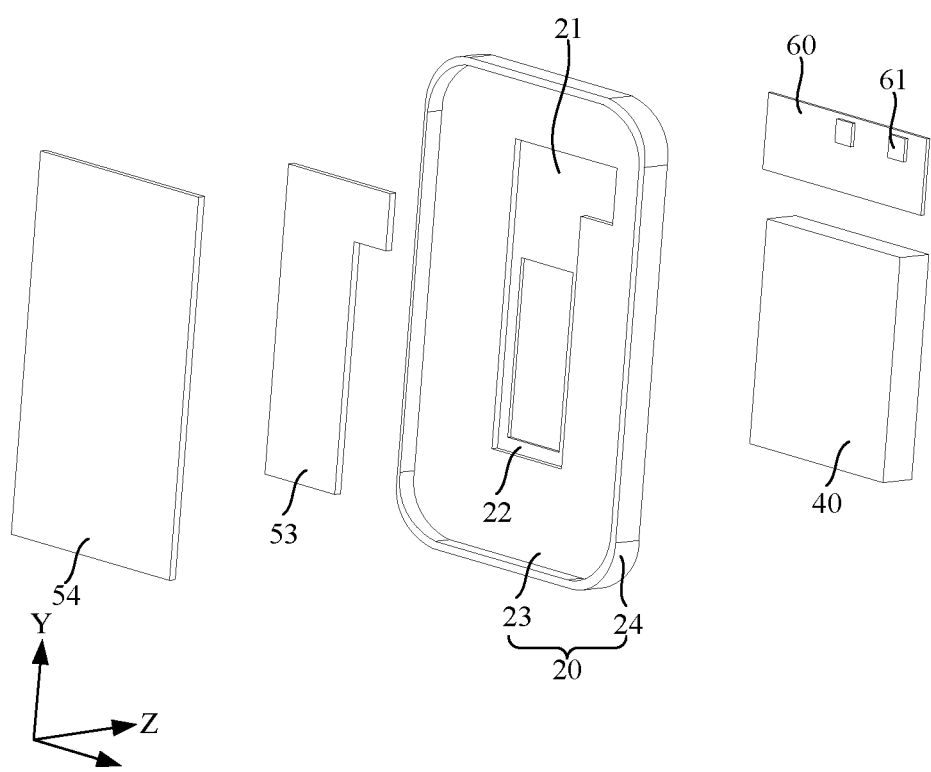
FIG. 14 is a partial schematic exploded diagram of another electronic device when a heat plate is in a second shape according to an embodiment of this application.

For example, as shown in FIG. 14, two heating elements 61 are arranged on the first surface of the circuit board 60. The two heating elements 61 are spaced apart in a length direction of the electronic device 100, where one heating element 61 is located in the middle of the circuit board 60, and the other heating element 61 is located on a right side of the circuit board 60. Correspondingly, the heat conduction plate body 535 is rectangular, and the rectangular heat conduction plate body 535 has a part protruding out of the rectangular plate body 534 of the heat plate 53, to exactly face the heating element 61 on the right side of the circuit board 60.

Figure 15:
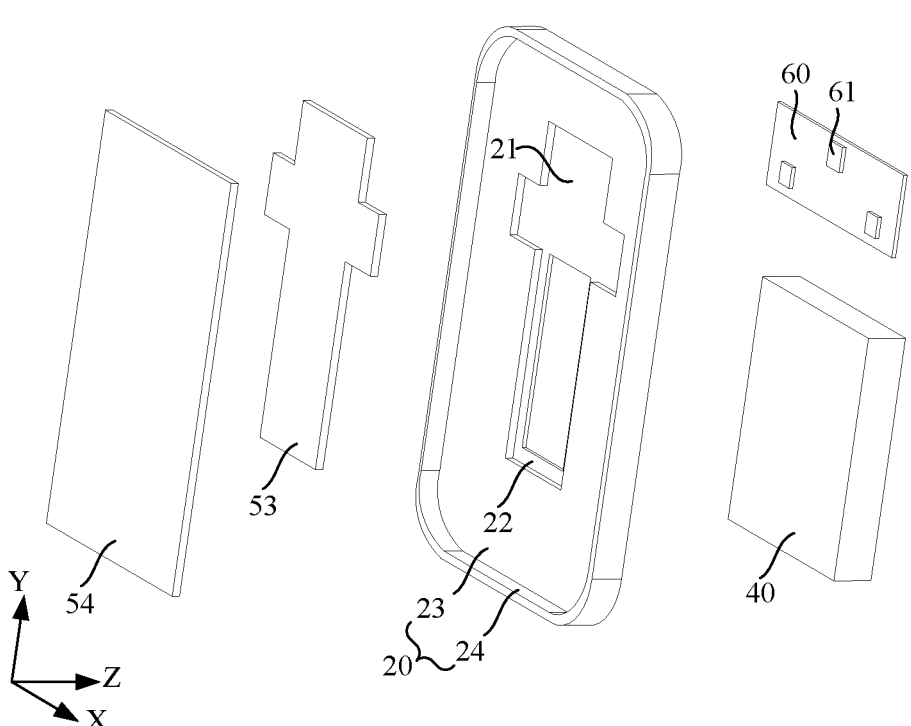
FIG. 15 is a partial schematic exploded diagram of another electronic device when a heat plate is in a third shape according to an embodiment of this application.

In another example, as shown in FIG. 15, three heating elements 61 are arranged on the first surface of the circuit board 60. The three heating elements 61 are spaced apart in a width direction of the electronic device 100, and the heating element 61 in the middle is located above the other two the heating elements 61. Correspondingly, the heat conduction plate body 535 is convex, so that the protruding part at the middle and upper end of the heat conduction plate body 535 exactly faces the heating element 61 in the middle, and the protruding parts on two sides of the heat conduction plate body 535 exactly face the other two heating elements

61 respectively. Certainly, in other embodiments of this application, the heat plate 53 may alternatively be in other shapes, which will not be listed herein.

It is to be noted that the relative positional relationship between the heating elements 61 and the heat conduction plate body 535 is that: all the heating elements 61 exactly face the heat conduction plate body, a minimum value of distances between first side edges of all the heating elements 61 and a same side edge of the heat conduction plate body 535 is a first distance a, and a minimum value of distances between second side edges of all the heating elements 61 and a same side edge of the heat conduction plate body 535 is a second distance b. The first side and the second side are opposite sides of the heating element 61 in the width direction of the electronic device 100. That is, the first side may be the left side of the heating element 61, and on the contrary, the second side is the right side of the heating element 61; or the first side may be the right side of the heating element 61, and on the contrary, the second side is the left side of the heating element 61.

In addition, a minimum value of distances between third side edges of all the heating elements 61 and a same side edge of the heat conduction plate body 535 is a third distance c, and a minimum value of distances between fourth side edges of all the heating elements 61 and a same side edge of the heat conduction plate body 535 is a fourth distance d. The third side and the fourth side are opposite sides of the heating element 61 in the length and width direction of the electronic device 100. That is, the third side may be the upper side of the heating element 61, and on the contrary, the fourth side is the lower side of the heating element 61; or the third side may be the lower side of the heating element 61, and on the contrary, the fourth side is the upper side of the heating element 61.

In addition, a, b, c, and d are all greater than 0. That is, the first distance, the second distance, the third distance, and the fourth distance are all positive numbers, so that the projection of the heating element 61 on the heat conduction plate body 535 is completely in the middle of the heat conduction plate body 535.

That is, the heat conduction plate body 535 is configured as that a left side edge thereof exceeds the leftmost side edge of all heating elements 61, and the excess distance is a first distance a; a right side edge of the heat conduction plate body 535 exceeds the rightmost side edge of all heating elements 61, and the excess distance is a second distance b; an upper side edge of the heat conduction plate body 535 exceeds the uppermost side edge of all heating elements 61, and the excess distance is a third distance c; and a lower side edge of the heat conduction plate body 535 exceeds the lowermost side edge of all heating elements 61, and the excess distance is a fourth distance d.

Based on this arrangement, the projection of the heating element 61 on the heat conduction plate body 535 is completely located in the middle of the heat conduction plate body 535, and the heat conduction range of the heat conduction plate body 535 can completely cover the surroundings of the heating element 61, so that the heat generated by the heating element 61 can all be dissipated from the surroundings and transferred to the heat conduction plate body 535, thereby facilitating heat dissipation of the electronic device 100.

An example in which the first side is the left side of the heating element 61, and the third side is the upper side of the heating element 61 is used for illustration below.

Figure 17:
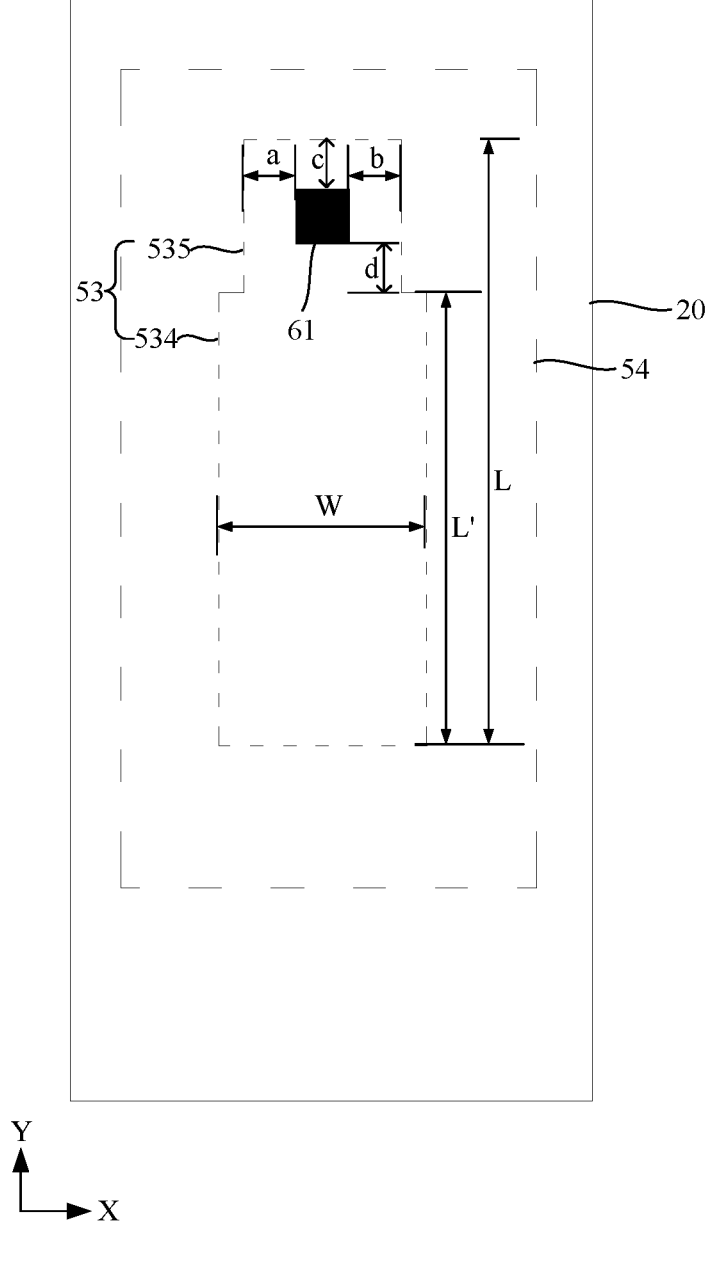
FIG. 17 is a schematic projection diagram of a middle frame, a first heat dissipation portion, and a heat plate in a first shape according to an embodiment of this application.

In FIG. 17, when one heating element 61 is arranged on the first surface of the circuit board 60, a distance between a left edge of the heating element 61 and a left edge of the heat conduction plate body 535 is a first distance a, a distance between a right edge of the heating element 61 and a right edge of the heat conduction plate body 535 is a second distance b, a distance between an upper edge of the heating element 61 and an upper edge of the heat conduction plate body 535 is a third distance c, and a distance between a lower edge of the heating element 61 and a lower edge of the heat conduction plate body 535 is a fourth distance d.

Figure 18:
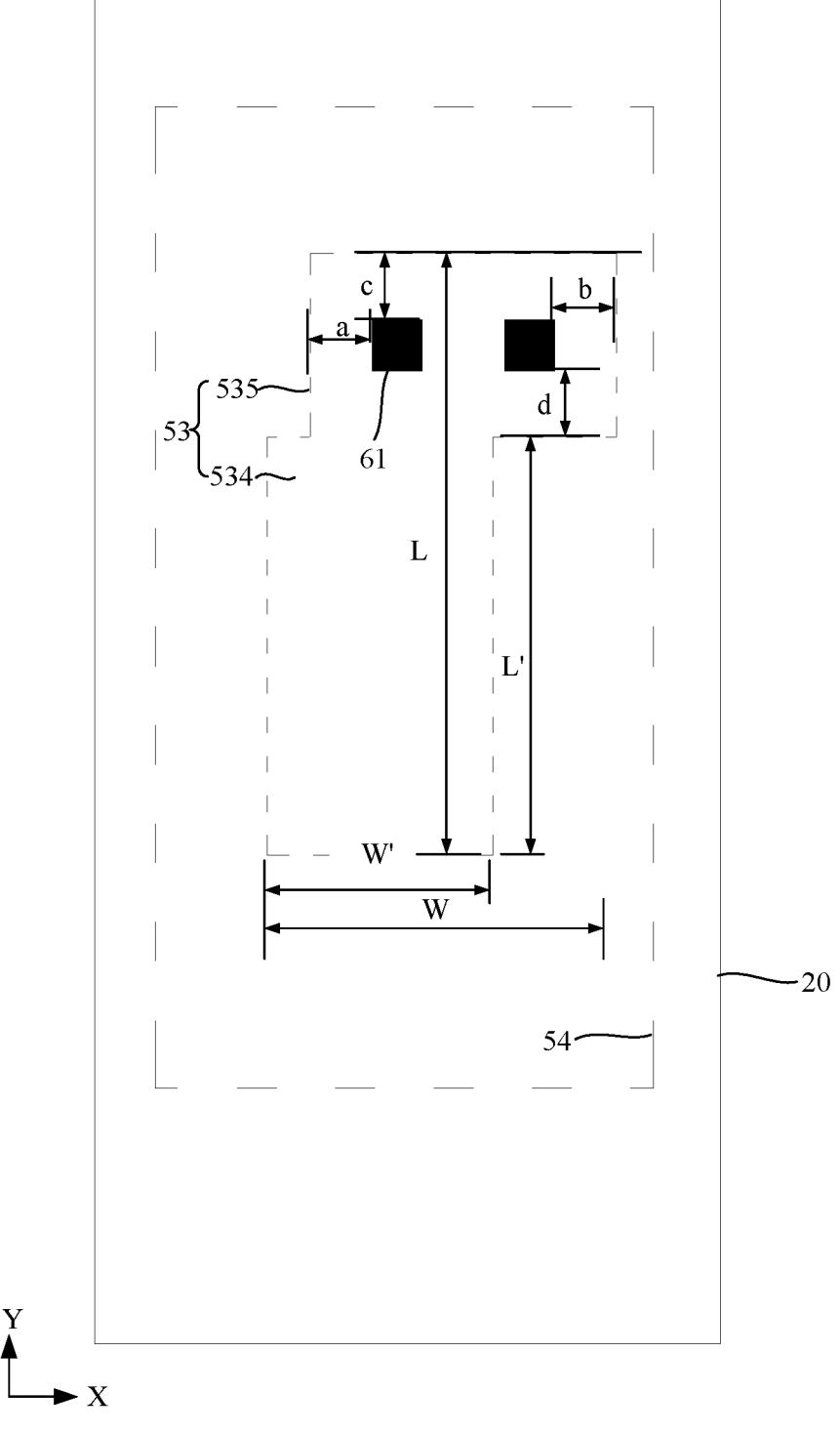
FIG. 18 is a schematic projection diagram of a middle frame, a first heat dissipation portion, and a heat plate in a second shape according to an embodiment of this application.

In FIG. 18, when two heating elements 61 are arranged on the first surface of the circuit board 60, a distance between a left edge of the more left one of the two heating elements 61 and a left edge of the heat conduction plate body 535 is a first distance a, a distance between a right edge of the more right one of the two heating elements 61 and a right edge of the heat conduction plate body 535 is a second distance b, a distance between an upper edge of the upper one of the two heating elements 61 and an upper edge of the heat conduction plate body 535 is a third distance c, and a distance between a lower edge of the lower one of the two heating elements 61 and a lower edge of the heat conduction plate body 535 is a fourth distance d.

Figure 19:
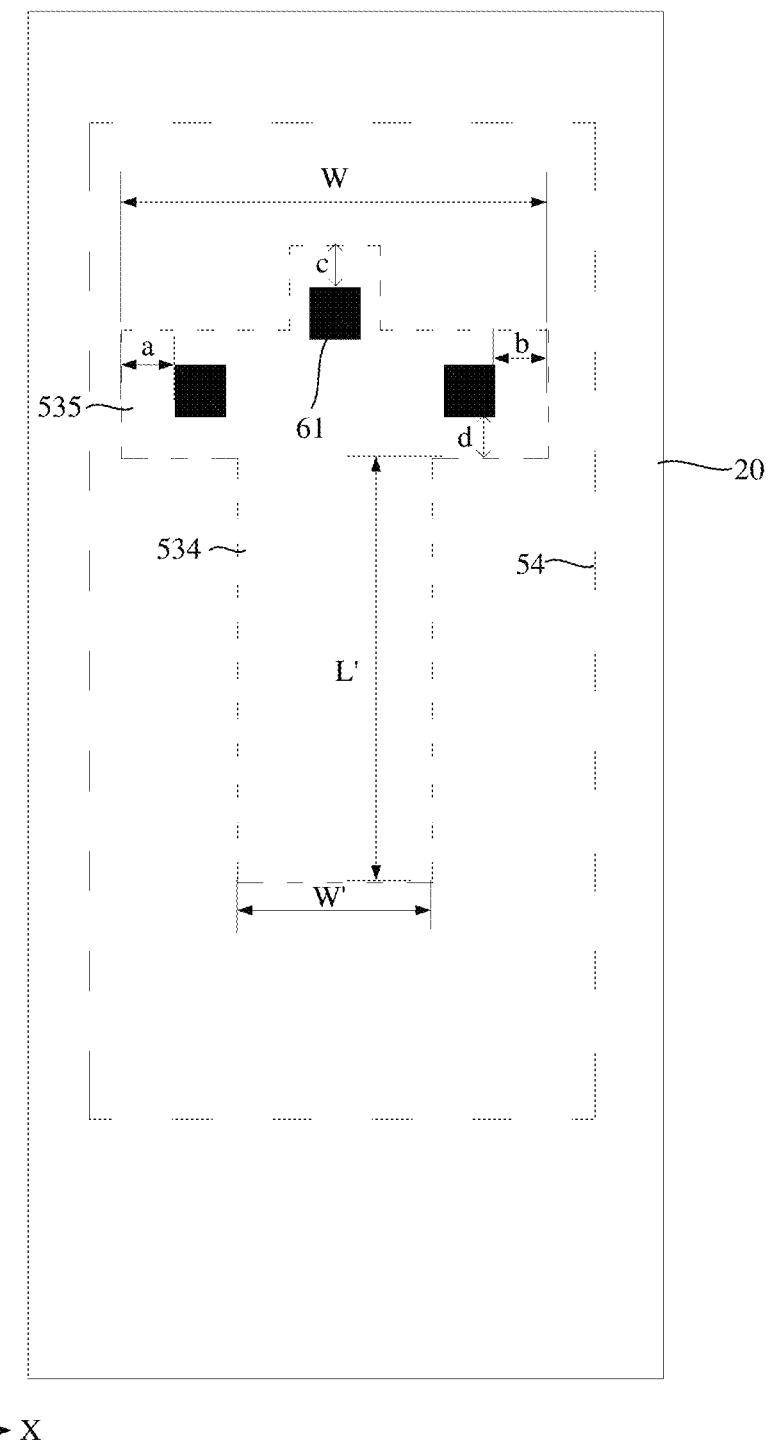
FIG. 19 is a schematic projection diagram of a middle frame, a first heat dissipation portion, and a heat plate in a third shape according to an embodiment of this application.

In FIG. 19, when three heating elements 61 are arranged on the first surface of the circuit board 60, a distance between a left edge of the leftmost one of the three heating elements 61 and a left edge of the heat conduction plate body 535 is a first distance a, a distance between a right edge of the rightmost one of the three heating elements 61 and a right edge of the heat conduction plate body 535 is a second distance b, a distance between an upper edge of the uppermost one of the three heating elements 61 and an upper edge of the heat conduction plate body 535 is a third distance c, and a distance between a lower edge of the lowermost one of the three heating elements 61 and a lower edge of the heat conduction plate body 535 is a fourth distance d.

Values of the first distance a, the second distance b, the third distance c, and the fourth distance d are not limited. In some examples, the first distance a and the second distance b may be equal or may not be equal. When the first distance a and the second distance b are equal, the distance by which the left edge of the heat conduction plate body 535 exceeds the left edge of the heating element 61 located on the leftmost side is equal to the distance by which the right edge of the heat conduction plate body 535 exceeds the right edge of the heating element 61 located on the rightmost side, thereby making the heat dissipation relatively even. Similarly, the third distance c and the fourth distance d may be equal or may not be equal. When the third distance c and the fourth distance d are equal, the distance by which the upper edge of the heat conduction plate body 535 exceeds the upper edge of the heating element 61 located on the uppermost side is equal to the distance by which the lower edge of the heat conduction plate body 535 exceeds the lower edge of the heating element 61 located on the lowermost side, thereby making the heat dissipation relatively even.

Certainly, when the first distance a is the same as the second distance b, and the third distance c is the same as the fourth distance d, the first distance a and the third distance c may also be equal. In this embodiment, the distances by which the heat conduction plate body 535 exceeds the surrounding edges of the heating element 61 are the same, so that the ranges of heat transfer from the surroundings of the heating element 61 to the heat plate 53 are basically the same, thereby facilitating even heat dissipation.

Specifically, both the first distance a and the second distance b may be greater than or equal to 1 mm and less than or equal to 20 mm, and the third distance c and the fourth distance d may also be greater than or equal to 1 mm and less than or equal to 20 mm.

The size of the rectangular plate body 534 of the heat plate 53 may be properly designed according to the size of the groove. For example, a width W of the rectangular plate body 534 of the heat plate 53 may be greater than or equal to 12 mm and less than or equal to 40 mm, and a length L' of the rectangular plate body 534 of the heat plate 53 may be greater than or equal to 20 mm and less than or equal to 70 mm.

With reference to the first distance a, the second distance b, the width value range of the rectangular plate body 534, and the layout of the heating element, a width W of the entire heat plate 53 may be designed to be greater than or equal to 20 mm and less than or equal to 50 mm; and with reference to the third distance c, the fourth distance d, the length value range of the rectangular plate body 534, and the layout of the heating element, a length L of the entire heat plate 53 may be designed to be greater than or equal to 40 mm and less than or equal to 120 mm.

Still referring to FIG. 4 and FIG. 5, the electronic device 100 may further include a battery 40. The battery 40 is also one of the electronic components of the electronic device 100, and is configured to supply power for the display screen 10, the heating element 61, and the like. The battery 40 is arranged on the side of the middle frame 20 facing away from the display screen 10, and the battery 40 and the circuit board 60 are spaced apart in the length direction of the middle frame 20. It is to be further noted that the circuit board 60 is arranged close to the top of the middle frame 20, to facilitate communication between the 4G PA and/or 5G PA on the circuit board 60 and a base station.

A part of the battery 40 and a part of the heat plate 53 are oppositely arranged on two sides of the middle frame 20. Therefore, the distance between the battery 40 and the heat plate 53 is relatively short, then a relatively short heat conduction path can be formed between the battery 40 and the heat plate 53, and some heat dissipated by the battery 40 during working can be quickly transferred to the heat plate 53 through the middle frame 20, thereby helping to resolve the problem of overheating of the electronic device 100 due to an excessively rapid temperature rise of the battery 40. It can be easily seen from this embodiment that because the heat plate 53 is not opposite to the entire battery 40, the heat plate 53 is arranged close to the top of the middle frame 20, and the bottom of the heat plate 53 does not extend to the bottom of the middle frame 20.

It may also be understood that in this embodiment, there are the following possible examples for the formation manner of the groove 21: In an example, the groove 21 is a blind hole, that is, the depth of the entire groove 21 is less than the thickness of the middle plate 23. In this way, the surface of the heat plate 53 facing away from the display screen 10 is completely in contact with the bottom wall of the groove 21, and the heat plate 53 is completely separated from the battery 40 or the circuit board 60 by the middle frame 20.

Figure 20:
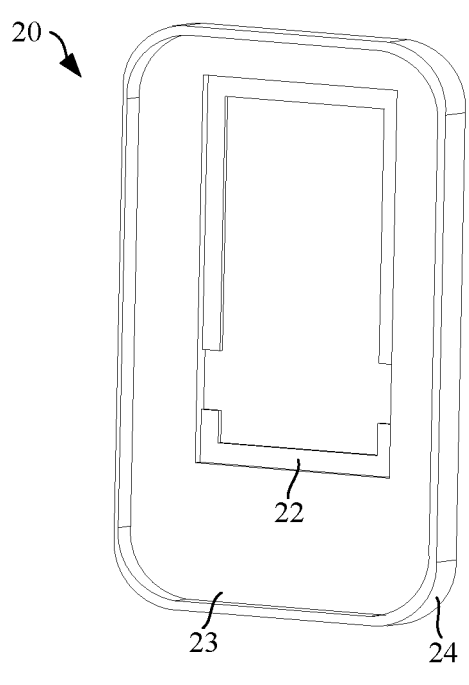
FIG. 20 is a schematic structural diagram of a middle frame according to an embodiment of this application.
Figure 21:
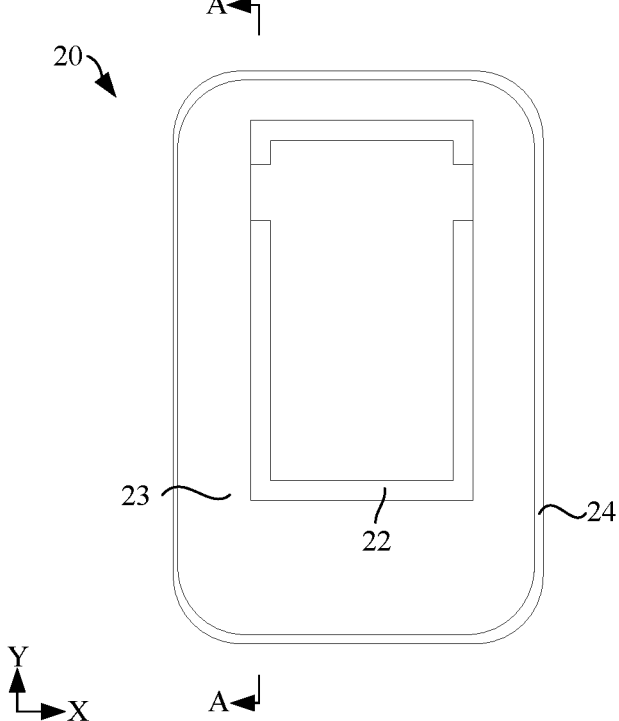
FIG. 21 is a front view of another middle frame according to an embodiment of this application.

In another example, as shown in FIG. 20 and FIG. 21, an opening is provided on the middle plate 23 of the middle frame 20, and an inner side wall of the opening is provided with an overlap edge 22 protruding into the opening. The overlap edge 22 and the middle frame 20 jointly form the groove 21. In this way, a part of the surface of the heat plate 53 facing away from the display screen 10 is in contact with the bottom wall of the groove 21, and the middle frame 20 does not completely separate the heat plate 53 from the battery 40 or the circuit board 60, provided that the heating element 61 can be in contact with the middle frame 20 through the heat conduction element.

Figure 22:
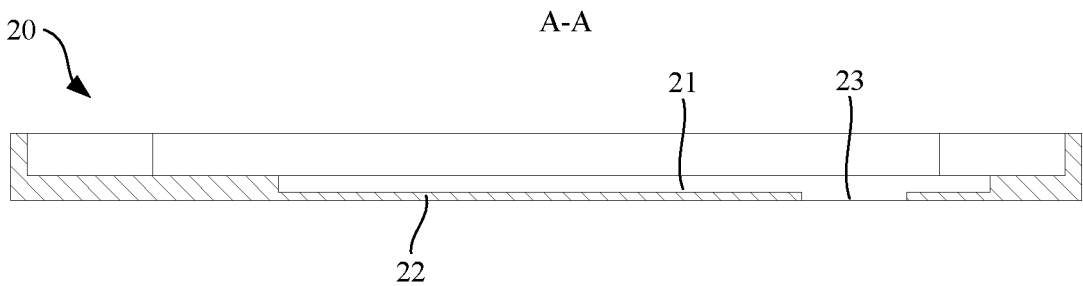
FIG. 22 is a cross-sectional view in an A-A direction in FIG. 21.

The overlap edge 22 may be connected to the entire circumferential inner side wall of the opening. Alternatively, as shown in FIG. 20 and FIG. 21, a partial circumferential inner side wall of the opening is provided with an overlap edge 22 in a protrusion manner. In other words, a notch is formed on the overlap edge 22, so that a through hole is formed on the middle plate 23 of the middle frame 20. Specifically, in the example shown in FIG. 20, the notch is provided close to the bottom of the groove 21, so that a through hole is formed at a part of the heat plate 53 corresponding to the battery 40 on the middle frame 20, then the part of the heat plate 53 opposite to the battery 40 is not separated by the middle frame 20. Therefore, both a part of the heat of the battery 40 and a part of the heat of the heat plate 53 can be dissipated in the through hole, thereby facilitating quick heat dissipation of the battery 40 and the heat plate 53. In the example shown in FIG. 21 and FIG. 22, the notch is provided close to the top of the groove 21, so that a through hole is provided at a part of the heat plate 53 corresponding to the circuit board 60 on the middle frame 20, then the heat plate 53 and the circuit board 60 are not completely separated by the middle frame 20. Therefore, a part of the heat of the heating element 61 and the heat plate 53 can be dissipated in the through hole, thereby facilitating quick heat dissipation of the heating element 61 and the heat plate 53.

Figure 12:
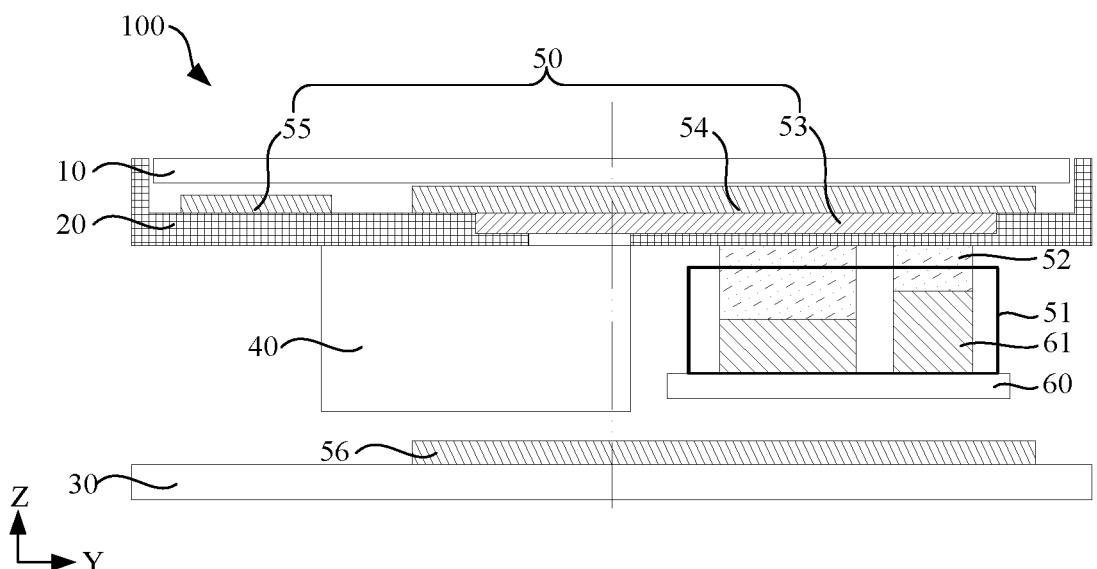
FIG. 12 is a schematic cross-sectional view of still another electronic device according to an embodiment of this application.

Based on the foregoing embodiments, referring to FIG. 12, the electronic device 100 further includes a heat sink 50, and the heat sink 50 is configured to assist other electronic components on the electronic device 100 in dissipating heat, so as to further improve the heat dissipation performance of the electronic device 100, thereby helping to reduce the possibility of overheating of the electronic device 100.

Figure 13:
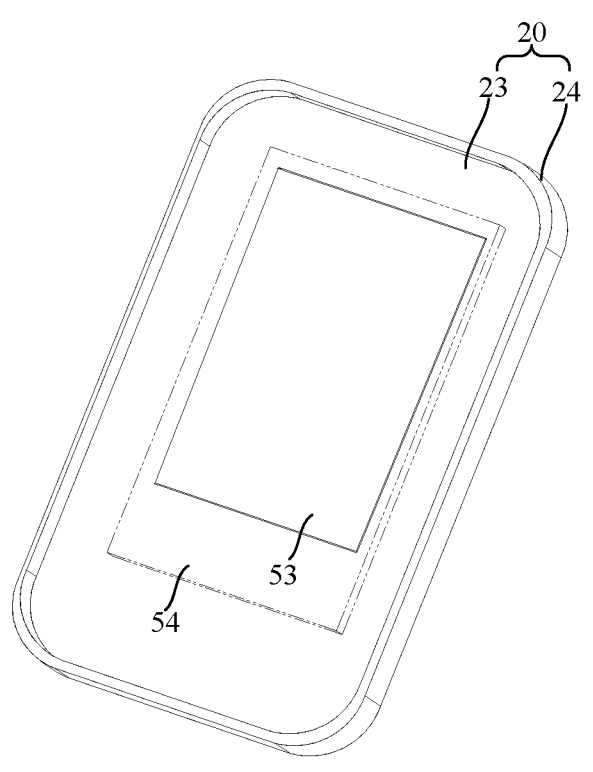
FIG. 13 is a schematic diagram of fitting between a middle frame, a first heat dissipation portion, and a heat plate in a first shape according to an embodiment of this application.
Figure 16:
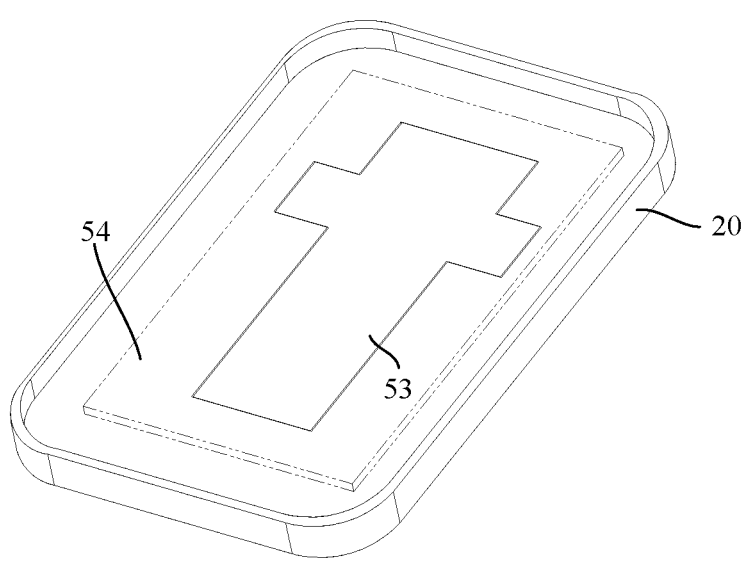
FIG. 16 is a schematic diagram of fitting between a middle frame, a first heat dissipation portion, and a heat plate in a third shape according to an embodiment of this application.

FIG. 12 is a cross-sectional view of another electronic device 100 taken in a direction of a reference line L-L in FIG. 1 according to this embodiment. Referring to FIG. 12, FIG. 13, and FIG. 16, the heat sink 50 may include a first heat dissipation portion 54 mounted on the middle frame 20, and the first heat dissipation portion 54 is also arranged between the heat plate 53 and the display screen 10. With such a design, when the electronic device 100 is working, the heat plate 53 receives the heat transferred by the heating element 61 and/or the battery 40 and conducts the heat to the first heat dissipation portion 54, then the first heat dissipation portion 54 can help the heat plate 53 dissipate the heat, thereby improving the heat dissipation efficiency of the heat plate 53, and further improving the heat dissipation performance of the electronic device 100.

When the thickness of the heat plate 53 is less than the depth of the groove 21, there is a gap between the heat plate 53 and the first heat dissipation portion 54. In this example, the first heat dissipation portion 54 may be bonded to the middle frame 20.

When the depth of the groove 21 is the same as the thickness of the heat plate 53, the first heat dissipation portion 54 is in conflict with the heat plate 53 and the middle plate 23 of the middle frame 20, and the middle frame 20 can stably support the first heat dissipation portion 54. Compared with existence of the gap between the first heat dissipation portion 54 and the heat plate 53, in this embodiment, the heat plate 53 can directly transfer heat to the first heat dissipation portion 54, and the heat transfer efficiency is high. The first heat dissipation portion 54 may be connected to the heat plate 53 and the middle frame 20 in a bonding manner.

Still referring to FIG. 13 and FIG. 16, in the thickness direction of the middle plate 23, the orthographic projection of the heat plate 53 on the back surface of the display screen 10 is located within the orthographic projection of the first heat dissipation portion 54 on the back surface of the display screen 10. That is, the first heat dissipation portion 54 can completely cover the heat plate 53, then the heat on the heat plate 53 can be transferred to the first heat dissipation portion 54 as much as possible, so that the electronic device 100 has good heat dissipation performance.

In a possible implementation, the structure of the first heat dissipation portion 54 may be the same as the structure of the heat plate 53. That is, the first heat dissipation portion 54 may also include a plurality of graphite sheets 530 arranged in a stacked manner. Certainly, the first heat dissipation portion 54 may also be any one of a single graphite sheet, copper foil, aluminum foil, a vapor chamber, or a heat pipe in the related art, which is not limited in this embodiment.

Further, the heat sink 50 may further include a second heat dissipation portion 55 mounted on the middle plate 23 of the middle frame 20, where the second heat dissipation portion 55 is located between the middle frame 20 and the display screen 10, and the second heat dissipation portion 55 and the first heat dissipation portion 54 are spaced apart in the length direction of the middle frame 20, so that the second heat dissipation portion 55 and the first heat dissipation portion 54 are side by side. By arranging the second heat dissipation portion 55, the middle frame 20 can transfer the heat generated by the battery 40 and/or the heating element 61 to the second heat dissipation portion 55, so that the middle frame 20 can quickly dissipate heat and cool down.

Similar to the first heat dissipation portion 54, the second heat dissipation portion 55 may be formed by a single graphite sheet, or may be formed by a plurality of graphite sheets 530, or may be any one of copper foil, aluminum foil, a vapor chamber, or a heat pipe in the related art.

The electronic device 100 may further include a rear cover 30, and the rear cover 30 is arranged on a side of the middle frame 20 facing away from the display screen 10. Both the circuit board 60 and the battery 40 are arranged between the middle frame 20 and the rear cover 30, and the rear cover 30 can protect the battery 40 and the circuit board 60. Based on this, the heat sink 50 may further include a third heat dissipation portion 56, and the third heat dissipation portion 56 is arranged between the battery 40 and the rear cover 30. With such a design, when the electronic device 100 is working, a part of the heat generated by the battery 40 can be transferred to the third heat dissipation portion 56, and then the third heat dissipation portion 56 conducts the received heat to the rear cover 30, so that the battery 40 can dissipate heat and cool down.

With reference to the foregoing description and FIG. 23, when a heating element 61 is arranged on the second surface of the circuit board 60, a shielding cover 51 is arranged on the second surface of the circuit board 60. The shielding cover 51 and the second surface of the circuit board 60 jointly define a shielding space for accommodating the heating element 61. The heating element 61 arranged on the second surface is connected to the shielding cover 51 through thermally conductive gel 52, and thermally conductive gel 52 is also provided between the shielding cover 51 and the third heat dissipation portion 56. In this way, the heat generated by the heating element 61 arranged on the second surface can be conducted to the third heat dissipation portion 56 through the thermally conductive gel 52, then the third heat dissipation portion 56 transfers the heat to the rear cover 30, and the rear cover 30 emits the heat and dissipates the heat in the external environment, so that the heating element 61 arranged on the second surface can dissipate heat, thereby preventing the performance of the heating element 61 arranged on the second surface from being affected due to heat accumulation. In general, by arranging the third heat dissipation portion 56, the heat generated by the battery 40 and the heating element 61 arranged on the second surface can be evenly transferred to the rear cover 30.

The third heat dissipation portion 56 may be connected to the rear cover 30 in a bonding manner. For the structure of the third heat dissipation portion 56, reference may be made to the structure of the first heat dissipation portion 54. That is, the third heat dissipation portion 56 may be a single graphite sheet, or may be any one of copper foil, aluminum foil, a vapor chamber, or a heat pipe in the related art.

In addition, as shown in FIG. 23, a heat plate 53 may also be provided between the circuit board 60 and the third heat dissipation portion 56. Specifically, the shielding cover 51 is in contact with the heat plate 53 through the thermally conductive gel 52. In this embodiment, the heat generated by the heating element 61 arranged on the second surface can be transferred to the heat plate 53 first, and then the heat plate 53 conducts the heat to the third heat dissipation portion 56 and the rear cover 30. It can be seen that the heat plate 53 arranged between the circuit board 60 and the rear cover 30 can assist the heating element 61 in heat conduction, so that the heating element 61 can dissipate heat as soon as possible, thereby helping to improve the heat dissipation performance of the electronic device 100.

Embodiment 2

Figure 24:
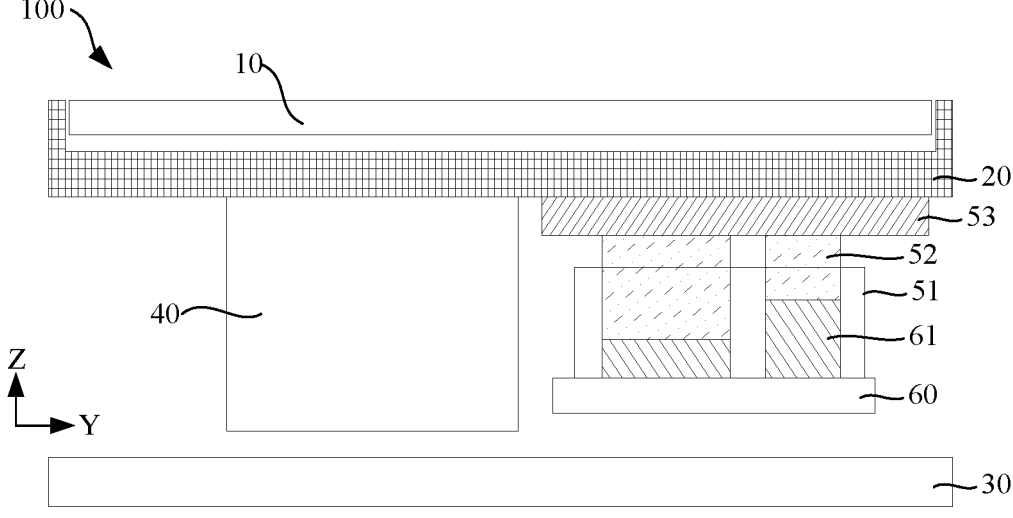
FIG. 24 is a schematic cross-sectional view of yet another electronic device according to an embodiment of this application.

Referring to FIG. 24, an embodiment of this application further provides an electronic device 100. The electronic device 100 also includes a display screen 10, a middle frame 20, a circuit board 60, a heating element 61, a heat conduction element, and a heat plate 53. Different from Embodiment 1, in this embodiment, the heat plate 53 is arranged between the middle frame 20 and the circuit board 60, and the heating element 61 is in contact with the heat plate 53 through the heat conduction element.

An exemplary heat dissipation principle of the electronic device 100 provided in this embodiment is as follows: When the electronic device 100 is working, the heat generated by the heating element 61 is transferred to the heat plate 53 through the thermally conductive gel 52, then the heat plate 53 transfers the heat to the middle frame 20 in contact with the heat plate, and subsequently the middle frame 20 is in contact with the external environment to dissipate the heat in the external environment, thereby helping to avoid the problems of performance reduction and life shortening of the heating element 61 due to an excessive temperature rise.

The structure of the heat plate 53 in this embodiment is the same as the structure of the heat plate in Embodiment 1, and details will not be described herein again.

It is to be noted that, the embodiment in which the heat plate 53 is designed to have an uneven thickness is especially applicable to a situation that a plurality of heating elements 61 are mounted on the first surface of the circuit board 60, thicknesses of the plurality of heating elements 61 are different, and surfaces of the thermally conductive gel on the plurality of heating elements 61 facing the display screen 10 are not coplanar. Based on this arrangement, the thickness of the heat plate 53 can be adapted to the thickness of the heating element 61, so that the heat plate 53 can be in contact with the thermally conductive gel 52 on each heating element 61, and the heat generated by each heating element

61 can all be transferred to the heat plate 53 through the thermally conductive gel 52, thereby ensuring that the electronic device 100 has relatively good heat dissipation performance.

In the description of the embodiments of this application, it is to be noted that, unless otherwise explicitly specified and defined, the terms "mount", "connect", and "connection" should be understood in a broadest sense, for example, fixed connection, indirect connection by a medium, or internal communication between two elements or an interaction relationship between the two elements. A person of ordinary skill in the art may understand the specific meanings of the foregoing terms in the embodiments of this application according to specific situations.

In the embodiments of this application, orientation or location relationships do not indicate or imply that the mentioned apparatus or element needs to have a particular orientation, or needs to be constructed and operated in a particular orientation, and therefore cannot be construed as a limitation on the embodiments of this application. In the description of the embodiments of this application, unless otherwise exactly and specifically specified, "a plurality of" means two or more than two.

The terms such as "first", "second", "third", and "fourth" (if any) in the specification and claims of the embodiments of this application and in the accompanying drawings are used for distinguishing between similar objects and not necessarily used for describing any particular order or sequence. It may be understood that the data termed in such a way is interchangeable in proper circumstances, so that the embodiments of this application described herein, for example, can be implemented in other orders than the order illustrated or described herein. In addition, the terms "include", "contain" and any other variants mean to cover the non-exclusive inclusion, for example, a process, method, system, product, or device that includes a list of steps or units is not necessarily limited to those expressly listed steps or units, but may include other steps or units not expressly listed or inherent to such a process, method, system, product, or device.

"Plurality of" in this specification means two or more. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects. In formulas, the character "/" indicates a "division" relationship between the associated objects.

It may be understood that, various reference numerals in the embodiments of this application are merely for differentiation for ease of description, and are not intended to limit the scope of the embodiments of this application.

It should be understood that in the embodiments of this application, an order of sequence numbers of the foregoing processes does not indicate an execution sequence, and execution sequences of the processes should be determined according to functions and internal logics thereof and should not impose any limitation on an implementation process of the embodiments of this application.

What is claimed is:

1. A heat plate, applied to an electronic device, and comprising:

a plurality of graphite sheets made of a graphite material or a graphene material, wherein the plurality of graphite sheets are arranged in a stacked manner, and a connection layer is arranged between each two adjacent graphite sheets of the plurality of graphite sheets; and wherein a first graphite sheet and a second graphite sheet have uneven thicknesses, wherein the first graphite sheet and the second graphite sheet are adjacent to each other, a first connection layer is between the first graphite sheet and the second graphite sheet, and wherein a thickness of a structure formed by the first graphite sheet, the second graphite sheet, and the first connection layer is even throughout the structure.

2. The heat plate according to claim 1, wherein:

the plurality of graphite sheets is two graphite sheets and the first connection layer is an adhesive layer; or when a quantity of graphite sheets of the plurality of graphite sheets is greater than two, a plurality of connection layers are comprised in the heat plate, at least one of the plurality of connection layers is an adhesive layer, and the remaining of the plurality of connection layers are metal bonding layers.

3. The heat plate according to claim 2, wherein each adhesive layer is a double-sided adhesive layer made of a double-sided adhesive material; or each adhesive layer is a thermally conductive gel layer made of thermally conductive gel.

4. The heat plate according to claim 1, wherein a thickness of each part of the heat plate is the same.

5. The heat plate according to claim 1, wherein the plurality of graphite sheets further comprises a third graphite sheet, the third graphite sheet and the first graphite sheet are outermost layers of the heat plate in a stacked arrangement direction, a surface of the first graphite sheet facing away from the second graphite sheet is provided with bonding glue, and a surface of the third graphite sheet facing away from the first graphite sheet is provided with a polyethylene terephthalate (PET) film.

6. The heat plate according to claim 1, wherein the thicknesses of the graphite sheets range from 0.07 mm to 0.2 mm.

7. The heat plate according to claim 6, wherein a thickness of at least one graphite sheet is one of 0.07 mm, 0.1 mm, 0.15 mm, or 0.2 mm.

8. The heat plate according to claim 1, wherein a thickness of the first connection layer ranges from 1 μm to 10 μm.

9. The heat plate according to claim 8, wherein the thickness of the first connection layer is 5 μm.

10. An electronic device, comprising: a middle frame, a display screen, a circuit board, a heating element, a heat conduction element and a heat plate, wherein the display screen and the circuit board are respectively arranged on two sides of the middle frame in a thickness direction of the electronic device, the heating element is arranged on the circuit board, the heating element is in contact with the middle frame through the heat conduction element, the middle frame is provided with a groove, and the heat plate is mounted in the groove; and the heat plate comprises a plurality of graphite sheets made of a graphite material or a graphene material, the plurality of graphite sheets are arranged in a stacked manner, a connection layer is arranged between each two adjacent graphite sheets of the plurality of graphite sheets, and thicknesses of at least two of the plurality of graphite sheets are different;

wherein there are a plurality of heating elements, the heat plate comprises a rectangular plate body and a heat conduction plate body, and the heating elements all exactly face the heat conduction plate body;

in a width direction of the electronic device, a minimum value of distances between first side edges of all the heating elements and a same side edge of the heat conduction plate body is a first distance, and a minimum value of distances between second side edges of all the heating elements and a same side edge of the heat conduction plate body is a second distance;

in a length direction of the electronic device, a minimum value of distances between third side edges of all the heating elements and a same side edge of the heat conduction plate body is a third distance, and a minimum value of distances between fourth side edges of all the heating elements and a same side edge of the heat conduction plate body is a fourth distance; and the first distance, the second distance, the third distance, and the fourth distance are all positive numbers.

11. The electronic device according to claim 10, wherein a thickness of the heat plate is not greater than a depth of the groove; and an orthographic projection of the heat conduction element on the display screen is located within an orthographic projection of the heat plate on the display screen.

12. The electronic device according to claim 11, wherein a shape of the heat plate is adapted to a shape constructed by the plurality of heating elements.

13. The electronic device according to claim 10, wherein the first distance is equal to the second distance, and the third distance is equal to the fourth distance.

14. The electronic device according to claim 10, further comprising a battery, wherein the battery is located on a side of the middle frame facing away from the display screen, the battery and the circuit board are spaced apart in a length direction of the middle frame, and a part of the battery is opposite to a part of the heat plate.

15. The electronic device according to claim 14, further comprising a first heat dissipation portion, wherein the first heat dissipation portion is located between the display screen and the heat plate, and an orthographic projection of the heat plate on the display screen is located within an orthographic projection of the first heat dissipation portion on the display screen.

16. The electronic device according to claim 10, wherein the plurality of graphite sheets is two graphite sheets and at least one connection layer is an adhesive layer.

17. The electronic device according to claim 10, wherein a quantity of graphite sheets of the plurality of graphite sheets is greater than two, a plurality of connection layers are comprised in the heat plate, at least one of the plurality of connection layers is an adhesive layer, and the remaining of the plurality of connection layers are metal bonding layers.

18. The electronic device according to claim 10, wherein each adhesive layer is a double-sided adhesive layer made of a double-sided adhesive material.

19. The electronic device according to claim 10, wherein each adhesive layer is a thermally conductive gel layer made of thermally conductive gel.

20. The electronic device according to claim 10, wherein the thicknesses of the graphite sheets range from 0.07 mm to 0.2 mm.

* * * * *